US012635353B2

(12) United States Patent
Kim et al.

(10) Patent No.: US 12,635,353 B2
(45) Date of Patent: May 19, 2026

(54) DISPLAY APPARATUS AND METHOD OF MANUFACTURING THE SAME

(71) Applicant: Samsung Display Co., Ltd., Yongin-si (KR)

(72) Inventors: Namjin Kim, Yongin-si (KR); Mikyung Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 350 days.

(21) Appl. No.: 18/361,477

(22) Filed: Jul. 28, 2023

(65) Prior Publication Data

US 2024/0107815 A1     Mar. 28, 2024

(30) Foreign Application Priority Data

Sep. 27, 2022     (KR) ........................ 10-2022-0122875

(51) Int. Cl.
H10K 59/122     (2023.01)
H10K 59/80     (2023.01)

(52) U.S. Cl.
CPC ........... H10K 59/122 (2023.02); H10K 59/80 (2023.02)

(58) Field of Classification Search
CPC .................................................. H10K 59/122
USPC .................................................. 313/498–512
See application file for complete search history.

(56) References Cited

U.S. PATENT DOCUMENTS

| 7,274,140 B2 | 9/2007 | Ito et al. |
| 7,432,533 B2 | 10/2008 | Auch et al. |
| 8,269,735 B2 | 9/2012 | Kim et al. |
| 10,418,429 B2 | 9/2019 | Kim et al. |
| 11,237,436 B2 | 2/2022 | Zhao et al. |
| 2019/0172885 A1 | 6/2019 | Lee et al. |
| 2020/0212331 A1 | 7/2020 | Lee |
| 2020/0212357 A1* | 7/2020 | Lim ........................ H10K 77/10 |
| 2021/0151718 A1* | 5/2021 | Han ........................ H10K 71/00 |
| 2022/0052267 A1* | 2/2022 | Jeong ................... H10K 71/621 |
| 2022/0328790 A1 | 10/2022 | Seon et al. |
| 2022/0351539 A1* | 11/2022 | Hai .................... G06V 40/1359 |
| 2024/0251640 A1* | 7/2024 | Kim ................. H10K 59/80521 |

FOREIGN PATENT DOCUMENTS

| CN | 108987449 B | 12/2018 |
| JP | 3984183 B2 | 10/2007 |
| JP | 2008-103173 A | 5/2008 |
| KR | 10-1500426 B1 | 3/2015 |

(Continued)

OTHER PUBLICATIONS

Choudhary, Ishan, et al., "Investigation of time-dependent stability and surface defects in sol-gel derived IGZO and IZO thin films," Journal of Sol-Gel Science and Technology, vol. 100, 2021, 20 pages; https://doi.org/10.1007/s10971-021-05615-w.

(Continued)

*Primary Examiner* — Christopher M Raabe

(74) *Attorney, Agent, or Firm* — Womble Bond Dickinson (US) LLP

(57) ABSTRACT

A display apparatus includes: a substrate; a pixel electrode over the substrate; a bank layer over the pixel electrode, and including a pixel opening exposing at least a portion of the pixel electrode; and a blocking layer to block ultraviolet rays, at least a portion of the blocking layer being located over the bank layer and spaced from the pixel electrode.

9 Claims, 29 Drawing Sheets

(56)         References Cited

FOREIGN PATENT DOCUMENTS

| KR | 10-2016-0139826 | A | 12/2016 |
| KR | 10-2019-0056670 | A | 5/2019 |
| KR | 10-2019-0067283 | A | 6/2019 |
| KR | 10-2020-0082753 | A | 7/2020 |
| KR | 10-2020-0145954 | A | 12/2020 |
| KR | 10-2206526 | B1 | 1/2021 |
| KR | 10-2022-0075736 | A | 6/2022 |
| KR | 10-2414593 | B1 | 6/2022 |

OTHER PUBLICATIONS

Knobelspies, Stefan, et al., "Photo-Induced Room-Temperature Gas Sensing with a-IGZO Based Thin-Film Transistors Fabricated on Flexible Plastic Foil," Sensors, 2018, vol. 18, 10 pages.

* cited by examiner

DISPLAY APPARATUS AND METHOD OF MANUFACTURING THE SAME

CROSS-REFERENCE TO RELATED APPLICATION

This application claims priority to and the benefit of Korean Patent Application No. 10-2022-0122875, filed on Sep. 27, 2022, in the Korean Intellectual Property Office, the entire disclosure of which is incorporated by reference herein.

BACKGROUND

1. Field

Aspects of one or more embodiments of the present disclosure relate to a display apparatus, and a method of manufacturing the display apparatus.

2. Description of the Related Art

Electronic apparatuses based on mobility have been widely used. Recently, in addition to small electronic apparatuses, such as mobile phones, tablet personal computers (PCs) have been widely used as mobile electronic apparatuses.

Such mobile electronic apparatuses include a display apparatus to provide visual information, such as images or videos, to a user in order to support various functions. Recently, as other components for driving a display apparatus have been miniaturized, a proportion of the display apparatus in an electronic apparatus has gradually increased, and a structure capable of being bent from a flat state to have a certain angle has been developed.

The above information disclosed in this Background section is for enhancement of understanding of the background of the present disclosure, and therefore, it may contain information that does not constitute prior art.

SUMMARY

One or more embodiments of the present disclosure are directed to a display apparatus in which ultraviolet rays transmitted through a bank layer and a spacer may be blocked to reduce an outgassing phenomenon in which gas may occur due to the bank layer and the spacer reacting with the ultraviolet rays.

However, the present disclosure is not limited to the above aspects and features.

Additional aspects and features will be set forth, in part, in the description that follows, and in part, will be apparent from the description, or may be learned by practicing one or more of the presented embodiments of the present disclosure.

According to one or more embodiments of the present disclosure, a display apparatus includes: a substrate; a pixel electrode over the substrate; a bank layer over the pixel electrode, and including a pixel opening exposing at least a portion of the pixel electrode; and a blocking layer configured to block ultraviolet rays, at least a portion of the blocking layer being located over the bank layer and spaced from the pixel electrode.

In an embodiment, the blocking layer may overlap with an upper surface of the bank layer.

In an embodiment, the blocking layer may include a first opening exposing at least a portion of an upper surface of the bank layer.

In an embodiment, an end of the blocking layer may be on a side surface of the bank layer.

In an embodiment, an end of the blocking layer may be on the upper surface of the bank layer.

In an embodiment, the display apparatus may further include a spacer over the bank layer, and at least a portion of the blocking layer may be located over the spacer.

In an embodiment, the blocking layer may include a second opening exposing an upper surface of the spacer.

In an embodiment, a height of an end of the blocking layer may be lower than a height of the upper surface of the spacer.

In an embodiment, an end of the blocking layer may be located on a side surface of the spacer.

In an embodiment, the display apparatus may further include: a planarization insulating layer located between the substrate and the pixel electrode; a first structure penetrating the planarization insulating layer; and an optical sensor overlapping with the first structure.

The above and other aspects and features will become more apparent from the detailed description, the accompanying drawings, and the appended claims.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
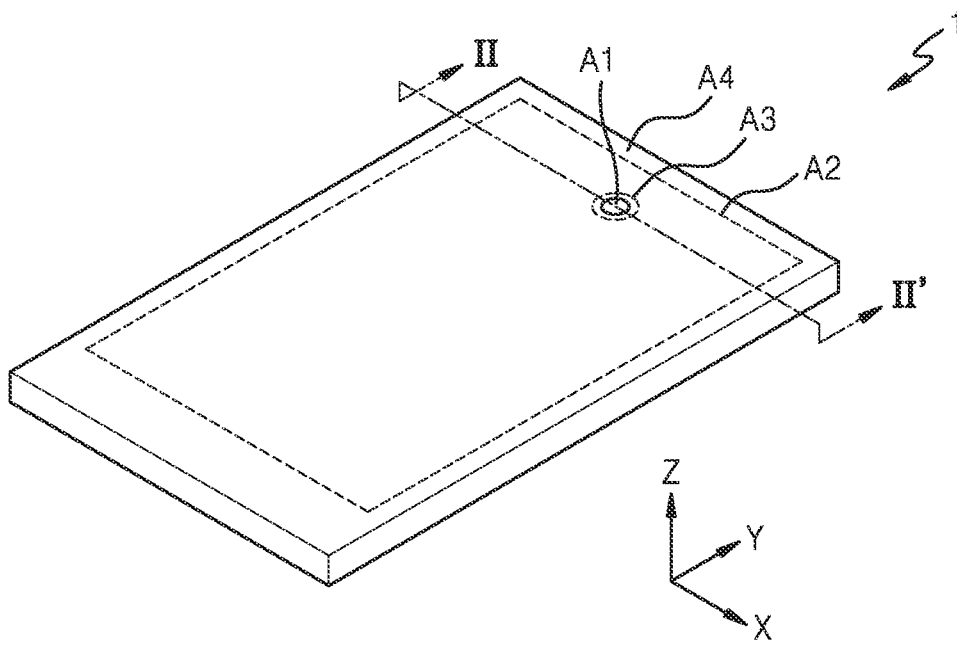
FIG. 1 is a perspective view schematically illustrating a display apparatus according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "over," "connected to," or "coupled to" another element or layer, it can be directly on, over, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view schematically illustrating a display apparatus according to an embodiment.

Referring to FIG. 1, a display apparatus 1 may include a first area A1, and a second area A2 surrounding (e.g., around a periphery of) the first area A1. A plurality of pixels, for example, such as an array of pixels, may be arranged at (e.g., in or on) the second area A2, and the second area A2 may be configured to display an image through the array of pixels. The second area A2 may correspond to an active area capable of displaying an image. The first area A1 may be entirely surrounded (e.g., around a periphery thereof) by the second area A2. The first area A1 may be an area in which an optical sensor capable of providing various suitable functions to the display apparatus 1 may be arranged. The first area A1 may correspond to a transmission area through which light propagating to the optical sensor may be transmitted.

A third area A3 may be provided between the first area A1 and the second area A2. The third area A3 may be a non-display area in which pixels are not arranged, and lines bypassing the first area A1 may be arranged at (e.g., in or on) the third area A3. A fourth area A4 surrounding (e.g., around a periphery of) the second area A2 may be a non-display area in which pixels are not arranged, and various lines and internal circuits may be arranged at (e.g., in or on) the fourth area A4.

Each pixel provided in the display apparatus 1 may include a light emitting diode as a display element capable of emitting light of a suitable color (e.g., a certain or predetermined color). For example, the light emitting diode may include an organic light emitting diode including an organic material as an emission layer. As another example, the light emitting diode may include an inorganic light emitting diode. As another example, the light emitting diode may include a quantum dot as an emission layer. Hereinafter, for convenience, the light emitting diode may be described in more detail in the context of an organic light emitting diode, but the present disclosure is not limited thereto.

FIG. 1 illustrates that the first area A1 is arranged at a center portion of the second area A2 in a widthwise direction (e.g., the X-axis direction) of the display apparatus 1. In other embodiments, the first area A1 may be arranged to be offset to the left side or the right side in the widthwise direction of the display apparatus 1. The first area A1 may be arranged at various suitable positions, such as at the upper side, at the center, or at the lower side in a lengthwise direction (e.g., the Y-axis direction) of the display apparatus 1.

FIG. 1 illustrates that the display apparatus 1 includes one first area A1, but in other embodiments, the display apparatus 1 may include a plurality of first areas A1.

Figure 2:
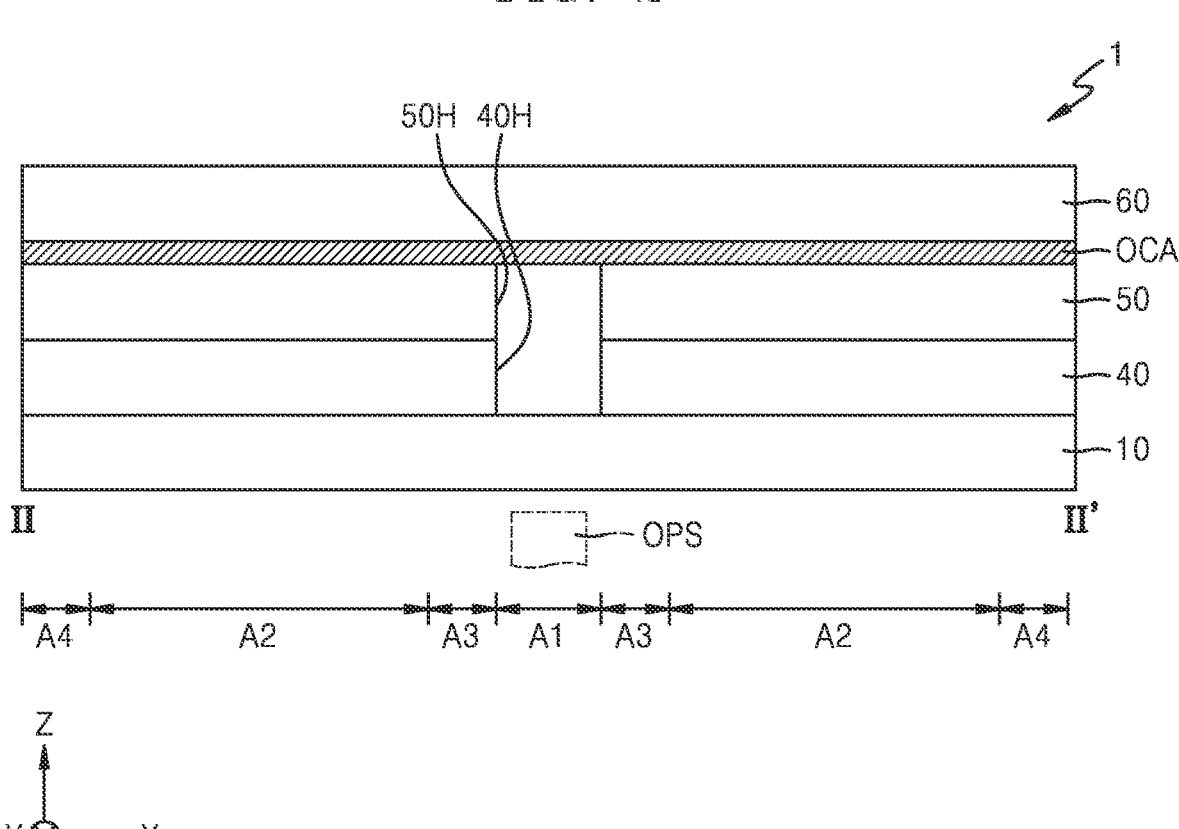
FIG. 2 is a cross-sectional view schematically illustrating a display apparatus according to an embodiment.

FIG. 2 is a cross-sectional view schematically illustrating a display apparatus according to an embodiment. For example, FIG. 2 may be a schematic view corresponding to a cross-section taken along the line II-II' of FIG. 1.

Referring to FIG. 2, the display apparatus 1 may include a display panel 10, an input sensing section (e.g., an input sensor or an input sensing layer) 40 arranged on the display panel 10, and an optical functional section (e.g., an optical functional layer) 50, which may be covered by a window 60. The window 60 may be coupled to (e.g., connected to or attached to) a component thereunder, for example, such as the optical functional section 50, through an adhesive layer, such as an optical clear adhesive OCA. The display apparatus 1 may be provided in various suitable electronic apparatuses, such as mobile phones, tablet PCs, notebook computers, smart watches, and/or the like.

The display panel 10 may include a plurality of diodes arranged at (e.g., in or on) the second area A2. The input sensing section 40 may be configured to obtain coordinate information according to an external input, for example, such as a touch event. The input sensing section 40 may include a sensing electrode (e.g., a touch electrode), and trace lines connected to the sensing electrode. The input sensing section 40 may be disposed over the display panel 10. The input sensing section 40 may be configured to sense an external input by a mutual capacitance method or a self capacitance method.

The input sensing section 40 may be directly formed over the display panel 10. As another example, the input sensing section 40 may be separately formed from the display panel 10, and then coupled (e.g., connected to or attached to) the display panel 10 through an adhesive layer, such as an optical clear adhesive OCA. In an embodiment, as illustrated in FIG. 2, the input sensing section 40 may be directly formed over the display panel 10, and in this case, no adhesive layer may be located between the input sensing section 40 and the display panel 10.

The optical functional section 50 may include an anti-reflection layer. The anti-reflection layer may be configured to reduce a reflectance of light (e.g., external light) incident from the outside through the window 60 toward the display panel 10. The anti-reflection layer may include a suitable material, such as a phase retarder and a polarizer. The phase retarder may be a film type or a liquid crystal coating type, and may include a half-waveplate ($\lambda/2$) phase retarder and/or a quarter-waveplate ($\lambda/4$) phase retarder. The polarizer may also be a film type or a liquid crystal coating type. The film type may include a stretched synthetic resin film, and the liquid crystal coating type may include liquid crystals arranged in a suitable arrangement (e.g., a certain or predetermined arrangement). The phase retarder and the polarizer may further include a protection film.

In other embodiments, the anti-reflection layer may include a structure including color filters and a black matrix. The color filters may be arranged considering the color of light emitted from each of the pixels of the display panel 10. In other embodiments, the anti-reflection layer may include a destructive interference structure. The destructive interference structure may include a first reflection layer and a second reflection layer arranged at (e.g., in or on) different layers from each other. First reflected light and second reflected light reflected by the first reflection layer and the second reflection layer, respectively, may destructively interfere with each other, and accordingly, the external light reflectance may be reduced.

The optical functional section 50 may include a lens layer. The lens layer may be configured to improve the light emission efficiency of light emitted from the display panel 10, or may be configured to reduce a color deviation. The lens layer may include a layer having a concave or convex lens shape, and/or may include a plurality of layers having different refractive indexes from one another. The optical functional section 50 may include both the anti-reflection layer and the lens layer, or may include any one of the anti-reflection layer or the lens layer.

The input sensing section 40 and the optical functional section 50 may each include a hole. For example, the input sensing section 40 may include a hole 40H passing through (e.g., penetrating) the top and bottom surfaces of the input sensing section 40, and the optical functional section 50 may include a hole 50H passing through (e.g., penetrating) the top and bottom surfaces of the optical functional section 50. The hole 40H of the input sensing section 40 and the hole 50H of the optical functional section 50 may be arranged in the first area A1, and may be arranged to correspond to (e.g., overlap with) each other.

When the adhesive layer between the window 60 and the optical functional section 50 includes the optical clear adhesive OCA, the adhesive layer may not include a hole corresponding to the first area A1.

An optical sensor OPS may be arranged in the first area A1. The optical sensor OPS may be an infrared sensor that receives and uses light, a camera that receives visible light to obtain an image, or a sensor that outputs and senses light to measure a distance or recognize a fingerprint. The optical sensor OPS may use light of various suitable wavelength bands, such as visible light, infrared light, and/or ultraviolet light. The first area A1 may be a transmission area through which light output from the optical sensor OPS to the outside or propagating from the outside toward the electronic element may be transmitted. The optical sensor OPS may include one or more suitable components capable of adding a desired function (e.g., a certain or predetermine function) to the display apparatus 1 as described above, or may include various suitable components, such as accessories, capable of increasing the beauty of the display panel 10.

Figure 3:
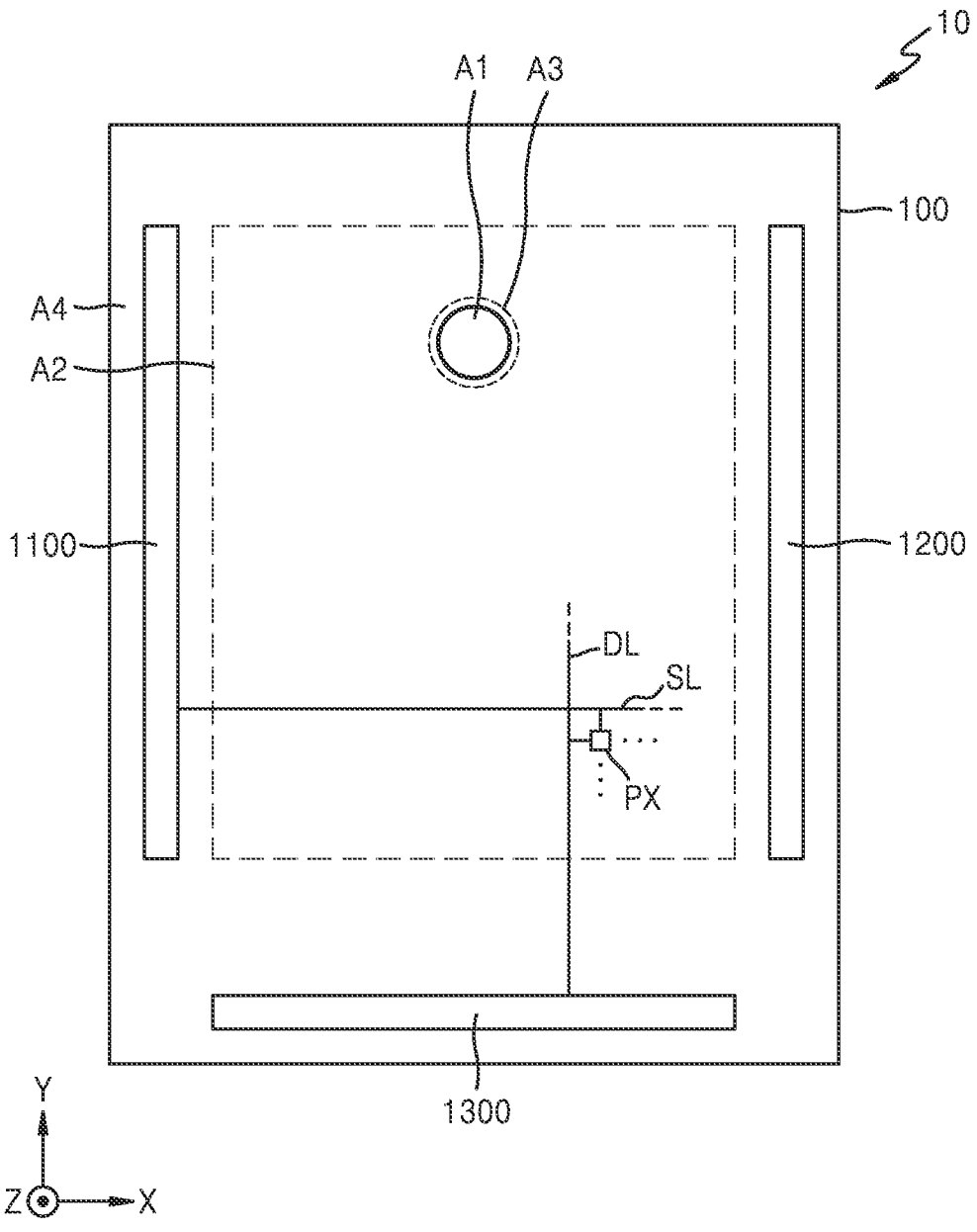
FIG. 3 is a plan view schematically illustrating a display panel according to an embodiment.
Figure 4:
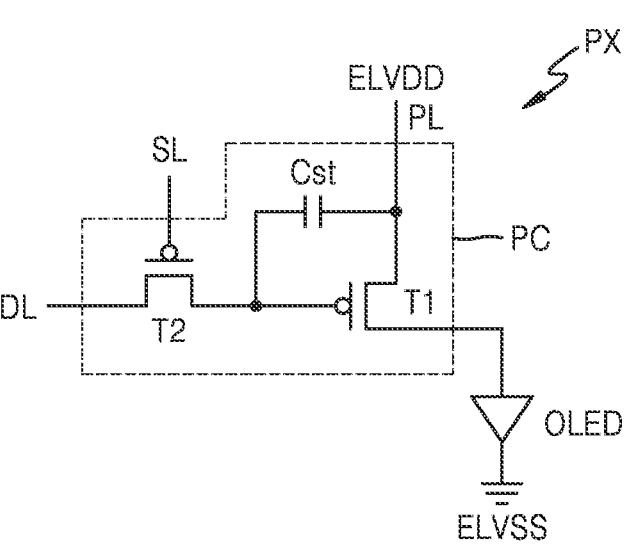
FIG. 4 is an equivalent circuit diagram schematically illustrating a pixel of a display panel.

FIG. 3 is a plan view schematically illustrating a display panel according to an embodiment. FIG. 4 is an equivalent circuit diagram schematically illustrating a pixel of a display panel. For example, the pixel PX illustrated in FIG. 4 may be an example of a pixel applied to the display panel 10.

The display panel 10 may include a first area A1, a second area A2 surrounding (e.g., around a periphery of) the first area A1, a third area A3 between the first area A1 and the second area A2, and a fourth area A4 surrounding (e.g., around a periphery of) the second area A2.

The display panel 10 may include a plurality of pixels PX arranged at (e.g., in or on) the second area A2. As illustrated in FIG. 4, each pixel PX may include a pixel circuit PC, and a display element connected to the pixel circuit PC, for example, such as an organic light emitting diode OLED. The pixel circuit PC may include a first transistor T1, a second transistor T2, and a storage capacitor Cst. Each pixel PX may emit, for example, red, green, or blue light, or red, green, blue, or white light from the organic light emitting diode OLED. The first transistor T1 and the second transistor T2 may be implemented as a thin film transistor.

As a switching transistor, the second transistor T2 may be connected to a scan line SL and a data line DL, and may be configured to transmit a data voltage input from the data line DL to the first transistor T1 according to a switching voltage input from the scan line SL. The storage capacitor Cst may be connected to the second transistor T2 and a driving voltage line PL, and may be configured to store a voltage corresponding to a difference between a voltage received from the second transistor T2 and a first power voltage ELVDD supplied to the driving voltage line PL.

As a driving transistor, the first transistor T1 may be connected to the driving voltage line PL and the storage capacitor Cst, and may be configured to control a driving current flowing from the driving voltage line PL through the organic light emitting diode OLED in response to a voltage value stored in the storage capacitor Cst. The organic light emitting diode OLED may emit light having a desired brightness (e.g., a certain or predetermined brightness) according to the driving current. An opposite electrode (e.g., a cathode) of the organic light emitting diode OLED may be supplied with a second power voltage ELVSS.

FIG. 4 illustrates that the pixel circuit PC includes two transistors and one storage capacitor, but the present disclosure is not limited thereto, and in other embodiments, the number of transistors and/or the number of storage capacitors may be variously modified according to a desired design of the pixel circuit PC.

Referring again to FIG. 3, the third area A3 may surround (e.g., around a periphery of) the first area A1. The third area A3 may be an area in which a display element, such as an organic light emitting diode for emitting light, is not arranged. Signal lines for providing signals to the pixels PX provided around (e.g., adjacent to) the first area A1 may pass through (e.g., may extend along) the third area A3. A first scan driver 1100 and a second scan driver 1200 for providing a scan signal to each of the pixels PX, a data driver 1300 for providing a data signal to each of the pixels PX, and a main power line for providing the first and second power voltages ELVDD and ELVSS may be arranged at (e.g., in or on) the fourth area A4. The first scan driver 1100 and the second scan driver 1200 may be arranged at (e.g., in or on) the fourth area A4, and may be arranged at opposite sides, respectively, of the second area A2, with the second area A2 therebetween.

FIG. 3 illustrates that the data driver 1300 is arranged adjacent to one side of a substrate 100, but in other embodiments, the data driver 1300 may be disposed over a flexible printed circuit board (FPCB) that is electrically connected to a pad arranged at one side of the display panel 10.

Figure 5:
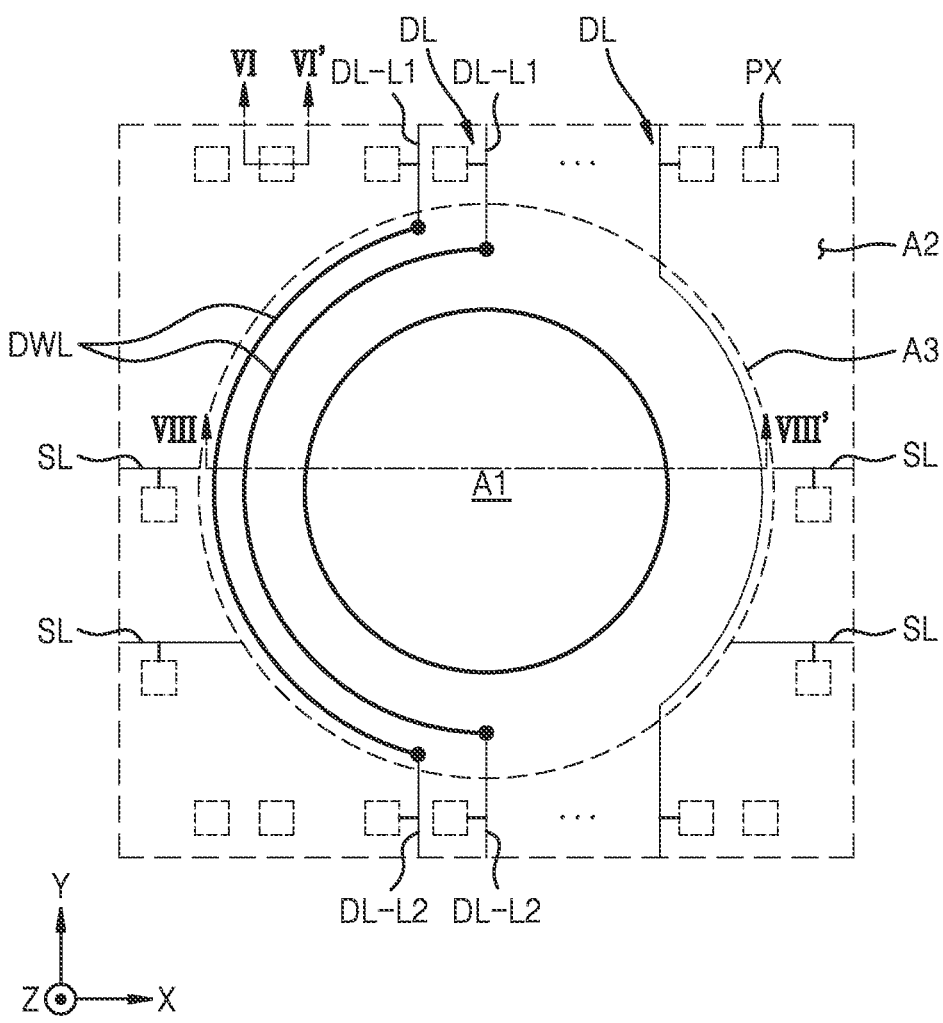
FIG. 5 is a plan view illustrating an enlarged portion of a display panel according to an embodiment.

FIG. 5 is a plan view illustrating an enlarged portion of a display panel according to an embodiment.

Referring to FIG. 5, some pixels PX from among the pixels PX formed at (e.g., in or on) the second area A2 may be spaced apart from each other with the first area A1 therebetween. For example, the first area A1 may be located between two pixels PX arranged along the X-axis direction of FIG. 5. Similarly, the first area A1 may be located between two pixels PX arranged along the Y-axis direction of FIG. 5.

Two pixels PX arranged along the Y-axis direction with the first area A1 therebetween may be electrically connected to the same data line DL, and the data line DL may be bent at (e.g., in or on) the third area A3. In other words, the data line DL may be arranged to bypass the first area A1. For example, a portion of the data line DL may be bent, and may extend along an edge of the first area A1 at (e.g., in or on) the third area A3, for example, along an arc direction of the first area A1.

In other embodiments, the data line DL may be disconnected with the first area A1 between disconnected portions of the data line DL. In other words, the data line DL may include a first data line DL-L1 and a second data line DL-L2 spaced apart from each other, with the first area A1 therebetween. The first data line DL-L1 and the second data line DL-L2 may be connected to each other by a bypass line DWL. The bypass line DWL may be arranged at (e.g., in or on) a different layer from that of the data line DL, and may be connected to the data line DL through a contact hole. The bypass line DWL may be arranged at (e.g., in or on) the third area A3, and may extend to bypass the first area A1 along the edge of the first area A1.

As used herein, the bypass line DWL may refer to a connection line for connecting the lines that are disconnected with the first area A1 therebetween, as well as all the lines extending from the second area A2 and passing through (e.g., extending along) the third area A3.

Two pixels PX arranged along the X-axis direction with the first area A1 therebetween may be electrically connected to different scan lines SL. The scan lines SL arranged on the left side of the first area A1 may be electrically connected to the first scan driver 1100, and the scan lines SL arranged on the right side of the first area A1 may be electrically connected to the second scan driver 1200 (e.g., see FIG. 3). When the display panel 10 includes two scan driving circuits as illustrated in FIG. 3, the pixels PX arranged on opposite sides of the first area A1 may be electrically connected to the scan lines SL that are spaced apart from each other. In other words, some of the scan lines SL may be spaced apart from each other, with the first area A1 therebetween.

In other embodiments, when the second scan driver 1200 is omitted, two pixels PX arranged along the X-axis direction with the first area A1 therebetween may be connected to the same scan line, and the scan line may include a bypass portion extending along the arc direction of the first area A1 at (e.g., in or on) the third area A3, similar to that of the data line DL.

Figure 6:
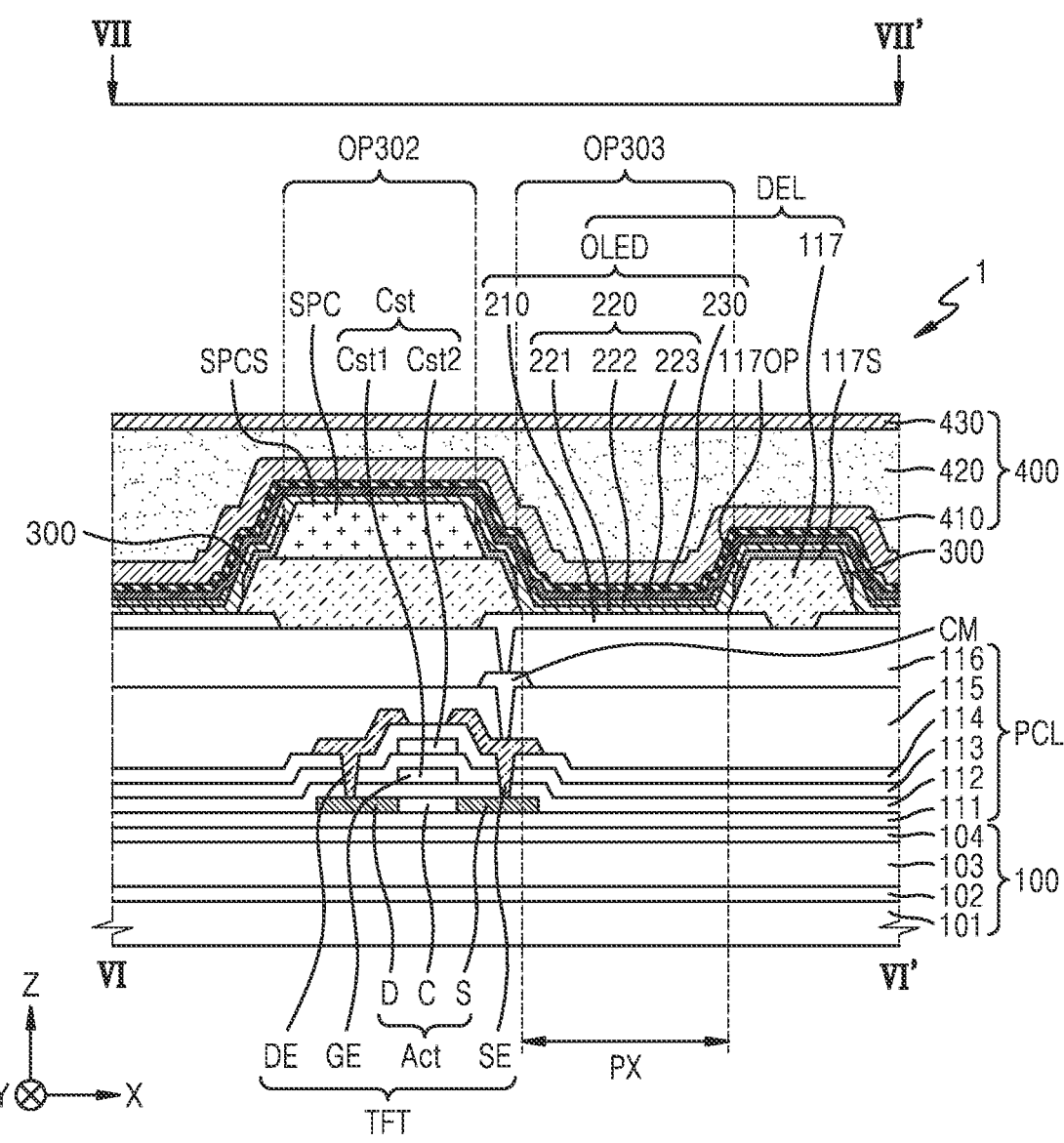
FIG. 6 is a cross-sectional view of a display apparatus according to an embodiment.

FIG. 6 is a cross-sectional view of a display apparatus according to an embodiment. For example, FIG. 6 may be a view corresponding to a cross-section taken along the line VI-VI' of FIG. 5.

Referring to FIG. 6, the display apparatus 1 may include a stacked structure of a substrate 100, a pixel circuit layer PCL, a display element layer DEL, a blocking layer 300, and an encapsulation layer 400.

The substrate 100 may have a multilayered structure including a base layer including a polymer resin, and an inorganic layer. For example, the substrate 100 may include the base layer including the polymer resin, and a barrier layer including an inorganic insulating layer. For example, the substrate 100 may include a first base layer 101, a first barrier layer 102, a second base layer 103, and a second barrier layer 104, which are sequentially stacked. The first base layer 101 and the second base layer 103 may include polyimide (PI), polyethersulfone (PES), polyarylate, polyetherimide (PEI), polyethylene naphthalate (PEN), polyethylene terephthalate (PET), polyphenylene sulfide (PPS), polycarbonate, cellulose triacetate (TAC), and/or cellulose acetate propionate (CAP). The first barrier layer 102 and the second barrier layer 104 may include an inorganic insulating material, such as silicon oxide, silicon oxynitride, and/or silicon nitride. The substrate 100 may be flexible.

The pixel circuit layer PCL may be disposed over the substrate 100. FIG. 6 illustrates that the pixel circuit layer PCL includes a thin film transistor TFT, and a buffer layer 111, a first gate insulating layer 112, a second gate insulating layer 113, an interlayer insulating layer 114, a first planarization insulating layer 115, and a second planarization insulating layer 116, which may be disposed under and/or over the elements of the thin film transistor TFT.

The buffer layer 111 may reduce or block the penetration of foreign materials, moisture, and/or external air from under the substrate 100, and may provide a flat or substantially flat surface over the substrate 100. The buffer layer 111 may include an inorganic insulating material, such as silicon oxide, silicon oxynitride, or silicon nitride, and may be formed in a single-layer or multiple-layered structure including one or more of the above inorganic insulating materials.

The thin film transistor TFT may be disposed over the buffer layer 111. The thin film transistor TFT may include a semiconductor layer Act, and the semiconductor layer Act may include polysilicon. As another example, the semiconductor layer Act may include amorphous silicon, an oxide semiconductor, an organic semiconductor, or the like. The semiconductor layer Act may include a channel area C, and a source area S and a drain area D arranged on opposite sides, respectively, of the channel area C. A gate electrode GE may overlap with the channel area C.

The gate electrode GE may include a low-resistance metal material. The gate electrode GE may include a conductive material including molybdenum (Mo), aluminum (Al), copper (Cu), titanium (Ti), or the like, and may include a single layer or multiple layers including one or more of the above conductive materials.

The first gate insulating layer 112 may be between the semiconductor layer Act and the gate electrode GE, and may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). The zinc oxide ($ZnO_x$) may include zinc oxide (ZnO) and/or zinc peroxide ($ZnO_2$).

The second gate insulating layer 113 may be provided to cover the gate electrode GE. Like the first gate insulating layer 112, the second gate insulating layer 113 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). The zinc oxide ($ZnO_x$) may include zinc oxide (ZnO) and/or zinc peroxide ($ZnO_2$).

An upper electrode Cst2 of the storage capacitor Cst may be disposed over the second gate insulating layer 113. The upper electrode Cst2 may overlap with the gate electrode GE thereunder. In this case, the gate electrode GE and the upper electrode Cst2 overlapping with each other with the second gate insulating layer 113 therebetween may form the storage capacitor Cst. In other words, the gate electrode GE may function as a lower electrode Cst1 of the storage capacitor Cst.

As such, the storage capacitor Cst and the thin film transistor TFT may be formed to overlap with each other. In some embodiments, the storage capacitor Cst may be formed to not overlap with the thin film transistor TFT.

The upper electrode Cst2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or multiple layers of one or more of the above materials.

The interlayer insulating layer 114 may cover the upper electrode Cst2. The interlayer insulating layer 114 may include an inorganic insulating material, such as silicon oxide ($SiO_2$), silicon nitride ($SiN_x$), silicon oxynitride (SiON), aluminum oxide ($Al_2O_3$), titanium oxide ($TO_2$), tantalum oxide ($Ta_2O_5$), hafnium oxide ($HfO_2$), or zinc oxide ($ZnO_x$). The zinc oxide ($ZnO_x$) may include zinc oxide (ZnO) and/or zinc peroxide ($ZnO_2$). The interlayer insulating layer 114 may include a single layer or multiple layers including one or more of the above inorganic insulating materials.

Each of a drain electrode DE and a source electrode SE may be located over the interlayer insulating layer 114. The drain electrode DE and the source electrode SE may be connected to the drain area D and the source area S, respectively, through contact holes formed in (e.g., penetrating) the insulating layers thereunder. The drain electrode DE and the source electrode SE may include a suitable material having high conductivity. The drain electrode DE and the source electrode SE may include a conductive material including molybdenum (Mo), aluminum (Al), copper (Cu), titanium (Ti), or the like, and may include a single layer or multiple layers including one or more of the above conductive materials. In an embodiment, the drain electrode DE and the source electrode SE may have a multilayered structure of Ti/Al/Ti.

A planarization insulating layer may be disposed over the substrate 100. The planarization insulating layer may be located between the substrate 100 and a pixel electrode 210. The planarization insulating layer may include the first planarization insulating layer 115 disposed over the substrate 100, and the second planarization insulating layer 116 disposed over the first planarization insulating layer 115.

The first planarization insulating layer 115 may cover the drain electrode DE and the source electrode SE. The first planarization insulating layer 115 may include an organic insulating material, such as a general-purpose polymer such as polymethylmethacrylate (PMMA) or polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, or any suitable blend thereof.

The second planarization insulating layer 116 may include the same material as that of the first planarization insulating layer 115. The second planarization insulating layer 116 may include an organic insulating material, such as a general-purpose polymer such as polymethylmethacrylate (PMMA) or polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, or any suitable blend thereof.

The display element layer DEL may be disposed over the pixel circuit layer PCL. The display element layer DEL may include an organic light emitting diode OLED as a display element (e.g., a light emitting element), and the organic light emitting diode OLED may include a stacked structure of a pixel electrode 210, an intermediate layer 220, and a common electrode 230. For example, the organic light emitting diode OLED may emit red, green, or blue light, or may emit red, green, blue, or white light. The organic light emitting diode OLED may emit light through an emission area, and the emission area may be defined as a pixel PX.

The pixel electrode 210 may be disposed over the substrate 100. The pixel electrode 210 may be disposed over the planarization insulating layer. For example, the pixel electrode 210 may be disposed over the second planarization insulating layer 116. The pixel electrode 210 of the organic light emitting diode OLED may be electrically connected to the thin film transistor TFT through contact holes formed in (e.g., penetrating) the second planarization insulating layer 116 and the first planarization insulating layer 115, and a contact metal CM disposed over the first planarization insulating layer 115.

The pixel electrode 210 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 210 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any suitable compound thereof. In another embodiment, the pixel electrode 210 may further include a layer formed of ITO, IZO, ZnO, or $In_2O_3$ over/under the reflective layer.

A bank layer 117 including a pixel opening 117OP exposing at least a portion of the pixel electrode 210 may be disposed over the pixel electrode 210. The bank layer 117 may include an organic insulating material and/or an inorganic insulating material. The pixel opening 117OP may define an emission area of light emitted from the organic light emitting diode OLED. For example, a size/width of the pixel opening 117OP may correspond to a size/width of the emission area. Thus, the size and/or width of the pixel PX may depend on the size and/or width of the pixel opening 117OP of the bank layer 117 corresponding thereto.

A spacer SPC may be disposed over the bank layer 117. The spacer SPC may have an island-shaped insulating pattern. The spacer SPC may have a polygonal shape, such as a square shape, a circular shape, a triangular shape, or an elliptical shape. The spacer SPC may include an organic insulating material, such as polyimide. As another example, the spacer SPC may include an inorganic insulating material, such as silicon nitride or silicon oxide, or may include an organic insulating material and an inorganic insulating material. The spacer SPC may include a different material from that of the bank layer 117. As another example, the spacer SPC may include the same material as that of one of the first planarization insulation layer 115, the second planarization insulation layer 116, and the bank layer 117.

The intermediate layer 220 may include an emission layer 222 formed to correspond to the pixel electrode 210. The emission layer 222 may include a high-molecular weight or a low-molecular weight organic material for emitting light of a desired color (e.g., a certain or predetermined color). As another example, the emission layer 222 may include an inorganic light emitting material, or may include quantum dots.

In an embodiment, the intermediate layer 220 may include a first functional layer 221 and a second functional layer 223 disposed under and over the emission layer 222, respectively. The first functional layer 221 may include, for example, a hole transport layer (HTL), or may include an HTL and a hole injection layer (HIL). The second functional layer 223 may be disposed over the emission layer 222, and may include an electron transport layer (ETL) and/or an electron injection layer (EIL). The first functional layer 221 and/or the second functional layer 223 may be a common layer formed to entirely or substantially entirely cover the substrate 100.

The common electrode 230 may be disposed over the pixel electrode 210, and may overlap with the pixel electrode 210. The common electrode 230 may include a conductive material having a low work function. For example, the common electrode 230 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any suitable alloy thereof. As another example, the common electrode 230 may further include a layer such as ITO, IZO, ZnO, or $In_2O_3$ over the (semi) transparent layer including one or more of the above materials. The common electrode 230 may be integrally formed to entirely or substantially entirely cover the substrate 100.

The encapsulation layer 400 may be disposed over the display element layer DEL, and may cover the display element layer DEL. The encapsulation layer 400 may include at least one inorganic encapsulation layer, and at least one organic encapsulation layer. In an embodiment, as illustrated in FIG. 6, the encapsulation layer 400 includes a first inorganic encapsulation layer 410, an organic encapsulation layer 420, and a second inorganic encapsulation layer 430 that are sequentially stacked.

The first inorganic encapsulation layer 410 and the second inorganic encapsulation layer 430 may include one or more inorganic materials from among aluminum oxide, titanium oxide, tantalum oxide, hafnium oxide, zinc oxide, silicon oxide, silicon nitride, and silicon oxynitride. The organic encapsulation layer 420 may include a polymer-based material. The polymer-based material may include an acryl-based resin, an epoxy-based resin, polyimide, polyethylene, and/or the like. In an embodiment, the organic encapsulation layer 420 may include acrylate. The organic encapsulation layer 420 may be formed by curing a monomer, or applying a polymer. The organic encapsulation layer 420 may be transparent.

In some embodiments, a touch sensor layer may be further disposed over the encapsulation layer 400, and an optical functional layer may be further disposed over the touch sensor layer. The touch sensor layer may be configured to obtain coordinate information according to an external input, for example, such as a touch event. The optical functional layer may reduce a reflectance of light (e.g., external light) incident from the outside toward the display apparatus, and/or may improve the color purity of light emitted from the display apparatus. In an embodiment, the optical functional layer may include a phase retarder and/or a polarizer. The phase retarder may be a film type or a liquid crystal coating type and may include a $\lambda/2$ phase retarder and/or a $\lambda/4$ phase retarder. The polarizer may also be a film type or a liquid crystal coating type. The film type may include a stretched synthetic resin film, and the liquid crystal coating type may include liquid crystals arranged in a suitable arrangement (e.g., a certain or predetermined arrangement). The phase retarder and the polarizer may further include a protection film.

An adhesive member may be arranged between the touch electrode layer and the optical functional layer. The adhesive member may include any suitable adhesive known to those having ordinary skill in the art. The adhesive member may include a pressure sensitive adhesive (PSA).

The blocking layer 300 may be disposed over the bank layer 117 and the spacer SPC. The blocking layer 300 may block ultraviolet rays. For example, the blocking layer 300 may reflect or absorb incident ultraviolet light. In this structure, the blocking layer 300 may reduce a phenomenon in which ultraviolet rays are transmitted through the bank layer 117, the spacer SPC, and the layers thereunder. Thus, a phenomenon in which the bank layer 117, the spacer SPC, and the layers thereunder react with the ultraviolet rays to induce outgassing may be reduced.

At least a portion of the blocking layer 300 may be disposed over the bank layer 117. The blocking layer 300 may overlap with an upper surface 117S of the bank layer 117. For example, the blocking layer 300 may overlap with the upper surface 117S of the bank layer 117 and a side surface of the bank layer 117. In this structure, a size of an overlapping area between the blocking layer 300 and the bank layer 117 may be increased. Thus, the blocking layer 300 may effectively reduce a phenomenon in which ultraviolet rays are transmitted through the bank layer 117.

At least a portion of the blocking layer 300 may be disposed over the spacer SPC. The blocking layer 300 may overlap with the side surface of the bank layer 117. The blocking layer 300 may overlap with at least one of the bank layer 117 or the spacer SPC disposed over the bank layer 117. For example, as illustrated in FIG. 6, the blocking layer 300 may overlap with both the bank layer 117 and the spacer SPC disposed over the bank layer 117. In this structure, an end of the blocking layer 300 may be arranged on a side surface of the spacer SPC and the bank layer 117. However, the present disclosure is not limited thereto, and the blocking layer 300 may overlap with one of the side surface of the bank layer 117 or the side surface of the spacer SPC.

The blocking layer 300 may include a second opening OP302 exposing an upper surface SPCS of the spacer SPC. An end of the blocking layer 300 may be arranged on the side surface of the spacer SPC, and a height (e.g., in the Z-axis direction) of the end of the blocking layer 300 may be lower than a height (e.g., in the Z-axis direction) of the upper surface SPCS of the spacer SPC. In this structure, in a process of disposing a mask assembly over the spacer SPC to deposit an emission layer, the mask assembly may not contact the blocking layer 300. Thus, a phenomenon in which the blocking layer 300 may be damaged due to a collision between the mask assembly and the blocking layer 300 may be prevented or substantially prevented.

The blocking layer 300 may be arranged to be spaced apart from the pixel electrode 210. The blocking layer 300 may include a third opening OP303 overlapping with the pixel electrode 210. In this case, an end of the blocking layer 300 may be arranged on the side surface of the bank layer 117. Thus, in a process of applying a voltage to the pixel electrode 210, a phenomenon in which electricity is generated between the pixel electrode 210 and the blocking layer 300 may be prevented or substantially prevented.

A thickness of the blocking layer 300 may be adjusted for sufficient and effective absorption and reflection of ultraviolet light. For example, the blocking layer 300 may have a thickness of about 500 Å to about 1000 Å. Also, the blocking layer 300 may include an inorganic blocking layer having suitable ultraviolet light blocking properties (e.g., excellent ultraviolet blocking properties), for example, such as at least one of $ZnO_x$, $TiO_x$, $Si_xN_y$, or $Ta_xO_y$. The blocking layer 300 may be provided as a layer with a suitable thickness (e.g., a certain or predetermined thickness) to effectively reflect and absorb ultraviolet light. As another example, the blocking layer 300 may be provided as a stacked structure of a plurality of layers to effectively block light in the ultraviolet light range.

Figure 7:
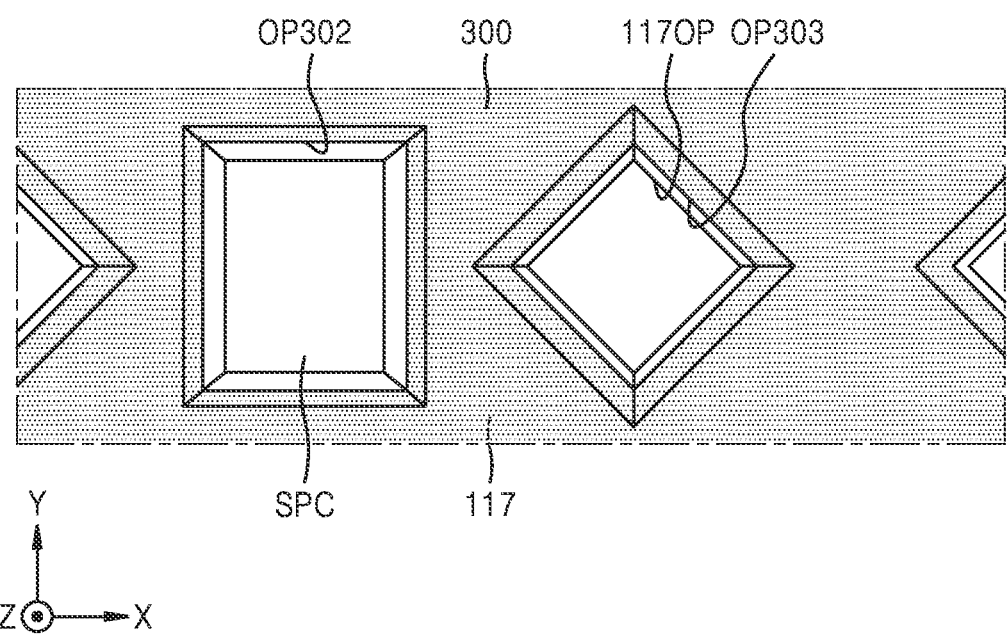
FIG. 7 is a plan view of a display apparatus according to an embodiment.

FIG. 7 is a plan view of a display apparatus according to an embodiment. For example, FIG. 7 may correspond to a view from a plane taken along the line VII-VII' of FIG. 6, and illustrates the bank layer 117, the spacer SPC, and the blocking layer 300.

An end of the blocking layer 300 may be arranged along a periphery of the side surface of the spacer SPC. A shape of the second opening OP302 of the blocking layer 300 may correspond to the shape of the spacer SPC. For example, as illustrated in FIG. 7, when the sample (e.g., the planar shape) of the spacer SPC is rectangular, the shape (e.g., the planar shape) of the second opening OP302 may be rectangular. However, the present disclosure is not limited thereto, and the blocking layer 300 and the spacer SPC may have any suitable shape (e.g., any suitable planar shape).

An end of the blocking layer 300 may be arranged along a periphery of the side surface of the bank layer 117. A shape of the third opening OP303 of the blocking layer 300 may correspond to a shape of the pixel opening 117OP of the bank layer 117. For example, as illustrated in FIG. 7, when the shape (e.g., the planar shape) of the pixel opening 117OP is rectangular, the shape (e.g., the planar shape) of the third opening OP303 may be rectangular. However, the present disclosure is not limited thereto, and the blocking layer 300 and the pixel opening 117OP may have any suitable shape (e.g., any suitable planar shape).

Figure 8:
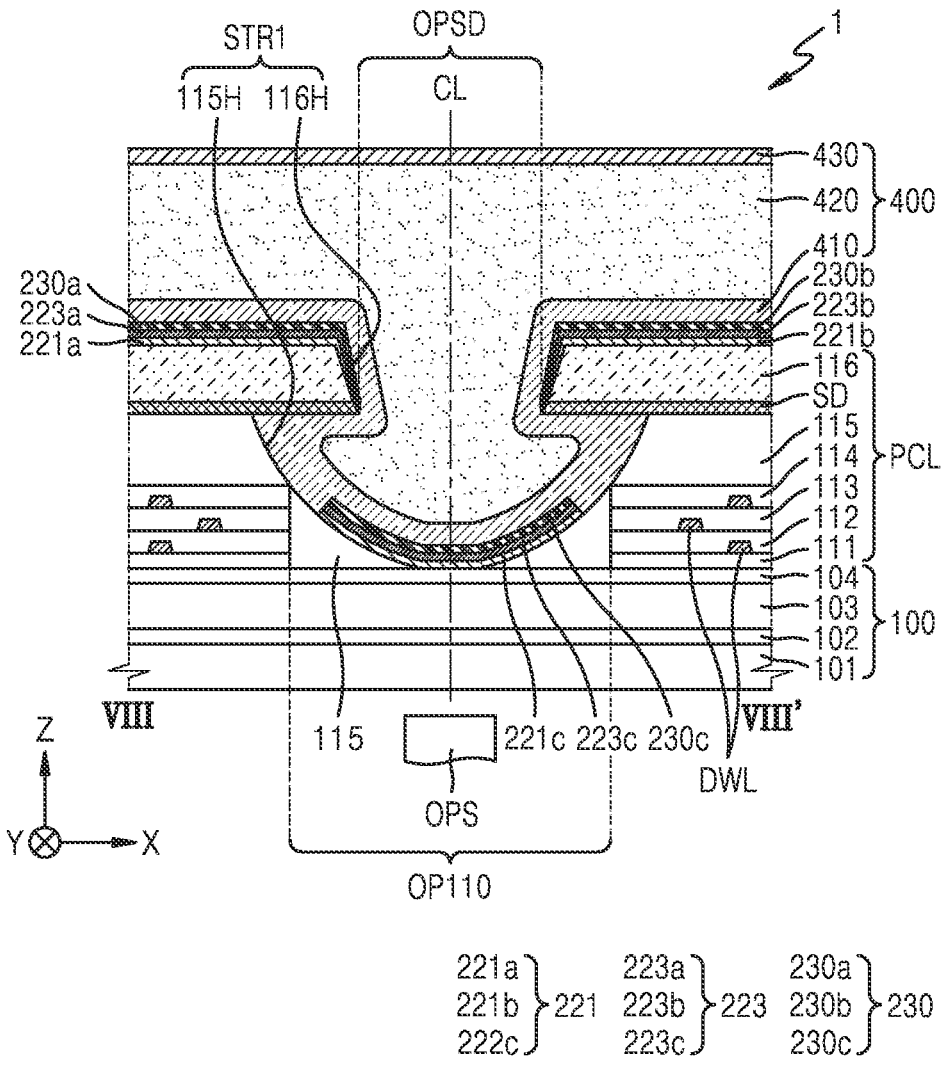
FIG. 8 is a cross-sectional view schematically illustrating a display apparatus according to an embodiment.

FIG. 8 is a cross-sectional view schematically illustrating a display apparatus according to an embodiment. For example, FIG. 8 may correspond to a view of a cross-section taken along the line VIII-VIII' of FIG. 5. In FIG. 8, the same reference numerals are used to denote the same or substantially the same elements and members as those described above with reference to FIG. 6, and thus, redundant description thereof may not be repeated.

The buffer layer 111, the first gate insulating layer 112, the second gate insulating layer 113, and the interlayer insulating layer 114 may include a fourth opening OP110. The fourth opening OP110 may pass through (e.g., may penetrate) the buffer layer 111, the first gate insulating layer 112, the second gate insulating layer 113, and the interlayer insulating layer 114. The fourth opening OP110 may be arranged at a position corresponding to the first area A1 (e.g., see FIGS. 1 through 3). Accordingly, light transmittance of the first area A1 may be increased. In some embodiments, when the first planarization insulating layer 115 is formed on the interlayer insulating layer 114, the first planarization insulating layer 115 may be formed to fill the fourth opening OP110. A bypass line DWL may be located between the buffer layer 111 and the first gate insulating layer 112, between the first gate insulating layer 112 and the second gate insulating layer 113, and/or between the second gate insulating layer 113 and the interlayer insulating layer 114.

A first structure STR1 may be arranged in the planarization insulating layer. The first structure STR1 may pass through (e.g., may penetrate) the planarization insulating layer. The first structure STR1 may include a second hole 115H arranged in (e.g., penetrating) the first planarization insulating layer 115, and a first hole 116H arranged in (e.g., penetrating) the second planarization insulating layer 116.

The second hole 115H may be arranged in (e.g., may penetrate) the first planarization insulating layer 115. The second hole 115H may overlap with the fourth opening OP110. The second hole 115H may include a convex curved surface. For example, a shape of the second hole 115H may include a hemispherical portion. The second hole 115H may pass through (e.g., may penetrate) the first planarization insulating layer 115, and thus, a portion of the upper surface of the substrate 100 may be exposed from the first planarization insulating layer 115. The second hole 115H may be arranged to contact (e.g., to expose) an edge of the interlayer insulating layer 114.

A source-drain layer SD may be disposed over the first planarization insulating layer 115. The source-drain layer SD may include a fifth opening OPSD. The fifth opening OPSD may overlap with the fourth opening OP110 and the second hole 115H. An area of a planar shape of the fifth opening OPSD may be smaller than an area of a planar shape of the second hole 115H. An end of the source-drain layer SD may protrude from the first planarization insulating layer 115 toward a center axis CL.

The second planarization insulation layer 116 may be disposed over the first planarization insulation layer 115. The first hole 116H may be arranged in (e.g., may penetrate) the second planarization insulating layer 116. The first hole 116H may include a slanted or a convex curved surface. For example, a shape of the first hole 116H may include a portion of a hemispherical portion. An edge of the second planarization insulating layer 116 may be arranged at the end of the source-drain layer SD.

The first functional layer 221 may include a (1-1)th functional layer 221a arranged on the left side with respect to the center axis CL, and a (1-2)th functional layer 221b arranged on the right side with respect to the center axis CL. The first functional layer 221 may further include a (1-3)th functional layer 221c arranged between the (1-1)th functional layer 221a and the (1-2)th functional layer 221b.

The (1-1)th functional layer 221a and the (1-2)th functional layer 221b may be disposed over the second planarization insulating layer 116. The (1-1)th functional layer 221a and the (1-2)th functional layer 221b may be arranged on the upper surface of the second planarization insulation layer 116, the side surface of the second planarization insulation layer 116, and the side surface of the source-drain layer SD. The (1-3)th functional layer 221c may be disposed over the substrate 100. The (1-3)th functional layer 221c may be arranged on the upper surface of the substrate 100, and a side surface of the first planarization insulating layer 115. The (1-3)th functional layer 221c may overlap with the fifth opening OPSD. For example, an area of a planar shape of the (1-3)th functional layer 221c may be greater than the area of the planar shape of the fifth opening OPSD.

The second functional layer 223 may include a (2-1)th functional layer 223a arranged on the left side with respect to the center axis CL, and a (2-2)th functional layer 223b arranged on the right side with respect to the center axis CL.

The second functional layer 223 may further include a (2-3)th functional layer 223c arranged between the (2-1)th functional layer 223a and the (2-2)th functional layer 223b.

The (2-1)th functional layer 223a may be disposed over the (1-1)th functional layer 221a, the (2-2)th functional layer 223b may be disposed over the (1-2)th functional layer 221b, and the (2-3)th functional layer 223c may be disposed over the (1-3)th functional layer 221c. The (2-3)th functional layer 223c may overlap with the fifth opening OPSD. For example, an area of a planar shape of the (2-3)th functional layer 223c may be greater than the area of the planar shape of the fifth opening OPSD.

The common electrode 230 may include a first common electrode 230a arranged on the left side with respect to the center axis CL, and a second common electrode 230b arranged on the right side with respect to the center axis CL. The common electrode 230 may further include a third common electrode 230c arranged between the first common electrode 230a and the second common electrode 230b.

The first common electrode 230a may be disposed over the (2-1)th functional layer 223a, the second common electrode 230b may be disposed over the (2-2)th functional layer 223b, and the third common electrode 230c may be disposed over the (2-3)th functional layer 223c. The third common electrode 230c may overlap with the fifth opening OPSD. For example, an area of a planar shape of the third common electrode 230c may be greater than the area of the planar shape of the fifth opening OPSD.

Because the end of the source-drain layer SD protrudes inward from the first planarization insulating layer 115, in a process of depositing the first functional layer 221, the second functional layer 223, and the common electrode 230, the (1-1)th functional layer 221a, the (1-2)th functional layer 221b, and the (1-3)th functional layer 221c may be arranged to be spaced apart from each other. Similarly, the (2-1)th functional layer 223a, the (2-2)th functional layer 223b, and the (2-3)th functional layer 223c may be arranged to be spaced apart from each other, and the first common electrode 230a, the second common electrode 230b, and the third common electrode 230c may be arranged to be spaced apart from each other. Thus, when moisture is injected into the (1-3)th functional layer 221c and the (2-3)th functional layer 223c, the moisture may be prevented or substantially prevented from being transmitted to the (1-1)th functional layer 221a and the (1-3)th functional layer 221c.

The first inorganic encapsulation layer 410 may be disposed over the second functional layer 223. The first inorganic encapsulation layer 410 may overlap with the upper surface of the second functional layer 223, the side surface of the first planarization insulating layer 115, and the lower surface of the source-drain layer SD. The first inorganic encapsulation layer 410 may seal between the first functional layer 221, the second functional layer 223, and the common electrode 230 that are divided into three parts.

The optical sensor OPS may be arranged to overlap with the first structure STR1. The optical sensor OPS may overlap with the first hole 116H, the fifth opening OPSD, and the second hole 115H. The optical sensor OPS may be arranged at a position corresponding to the first area A1 (e.g., see FIGS. 1 to 3).

FIGS. 9 through 26 are cross-sectional views illustrating various processes of a method of manufacturing a display apparatus according to an embodiment. In FIGS. 9 through 26, the same reference symbols are used to denote the same or substantially the same elements and members as those described above with reference to FIGS. 6 to 8, and thus, redundant description thereof may not be repeated.

Figure 9:
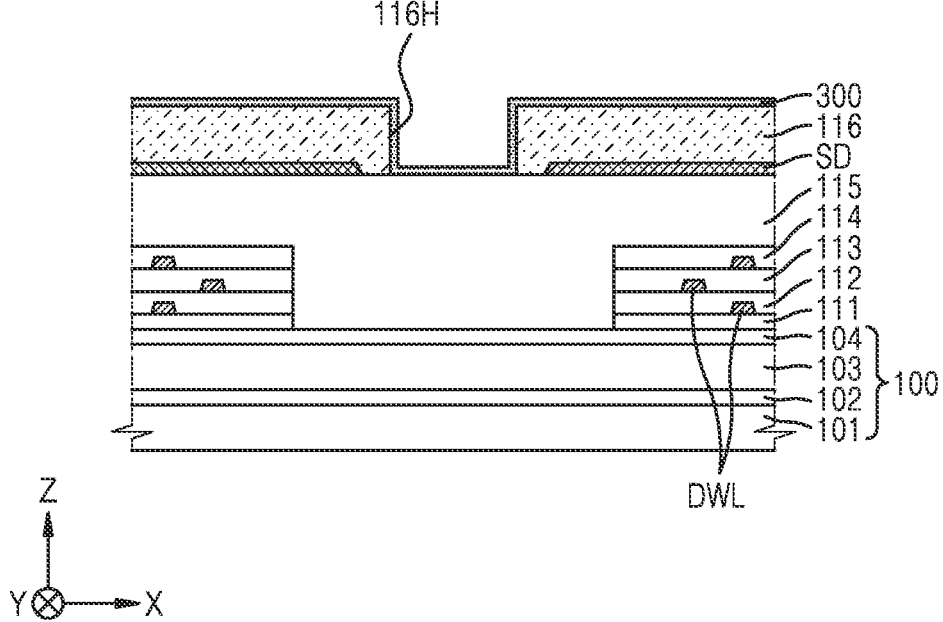
FIGS. 9-26 are cross-sectional views illustrating various processes of a method of manufacturing a display apparatus according to an embodiment.
Figure 10:
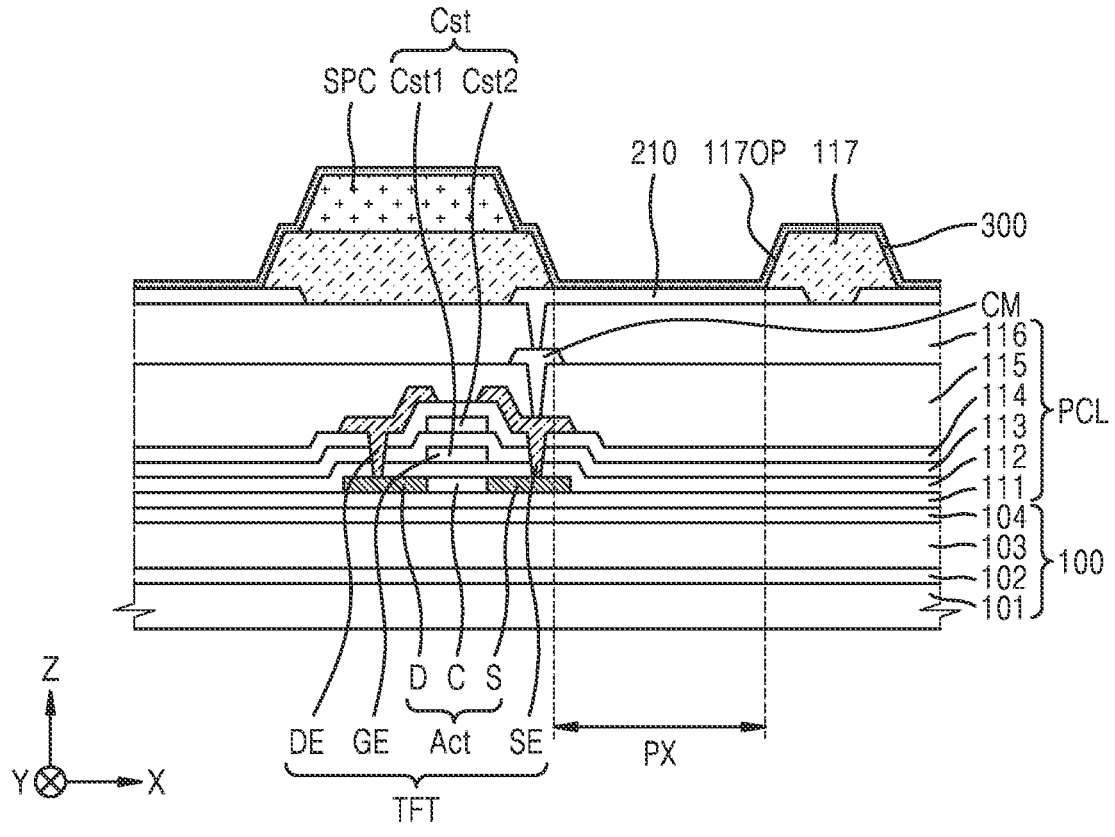

FIG. 9 may correspond to a view of a cross-section taken along the line VIII-VIII' of FIG. 5, and FIG. 10 may correspond to a view of a cross-section taken along the line VI-VI' of FIG. 5.

Referring to FIG. 9, a first hole 116H may be arranged in the second planarization insulating layer 116. For example, the first hole 116H may be arranged in the second planarization insulation layer 116 by removing a portion of the second planarization insulation layer 116. The first hole 116H may pass through (e.g., may penetrate) the second planarization insulating layer 116. A blocking layer 300 may be disposed over the second planarization insulating layer 116. The blocking layer 300 may be arranged along surfaces of the second planarization insulating layer 116 and the first planarization insulating layer 115. The blocking layer 300 may be arranged on the upper surface of the second planarization insulating layer 116. Also, the blocking layer 300 may be arranged on the side surface of the second planarization insulation layer 116 and the upper surface of the first planarization insulation layer 115, which are arranged in the first hole 116H.

Referring to FIG. 10, the blocking layer 300 may be disposed over the bank layer 117. The blocking layer 300 may be arranged along surfaces of the pixel electrode 210, the bank layer 117, and the spacer SPC. The blocking layer 300 may be arranged on the upper surface of the pixel electrode 210, the side and upper surfaces of the bank layer 117, and the side and upper surfaces of the spacer SPC.

The process of arranging the blocking layer 300 as illustrated FIG. 9 and the process of arranging the blocking layer 300 as illustrated in FIG. 10 may be concurrently (e.g., simultaneously or substantially simultaneously) performed with each other.

Figure 11:
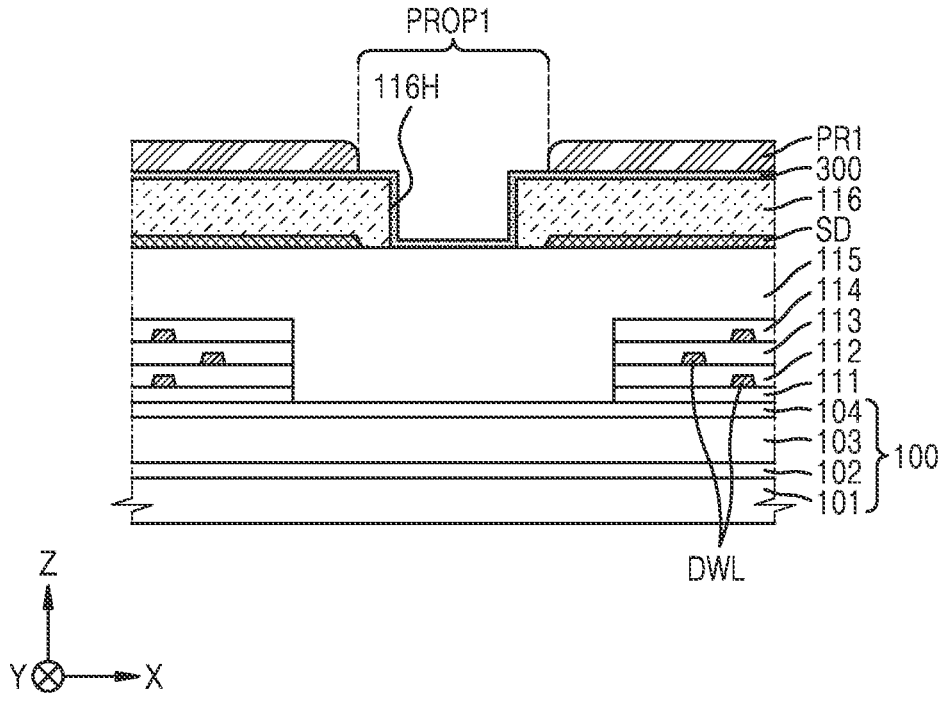
Figure 12:
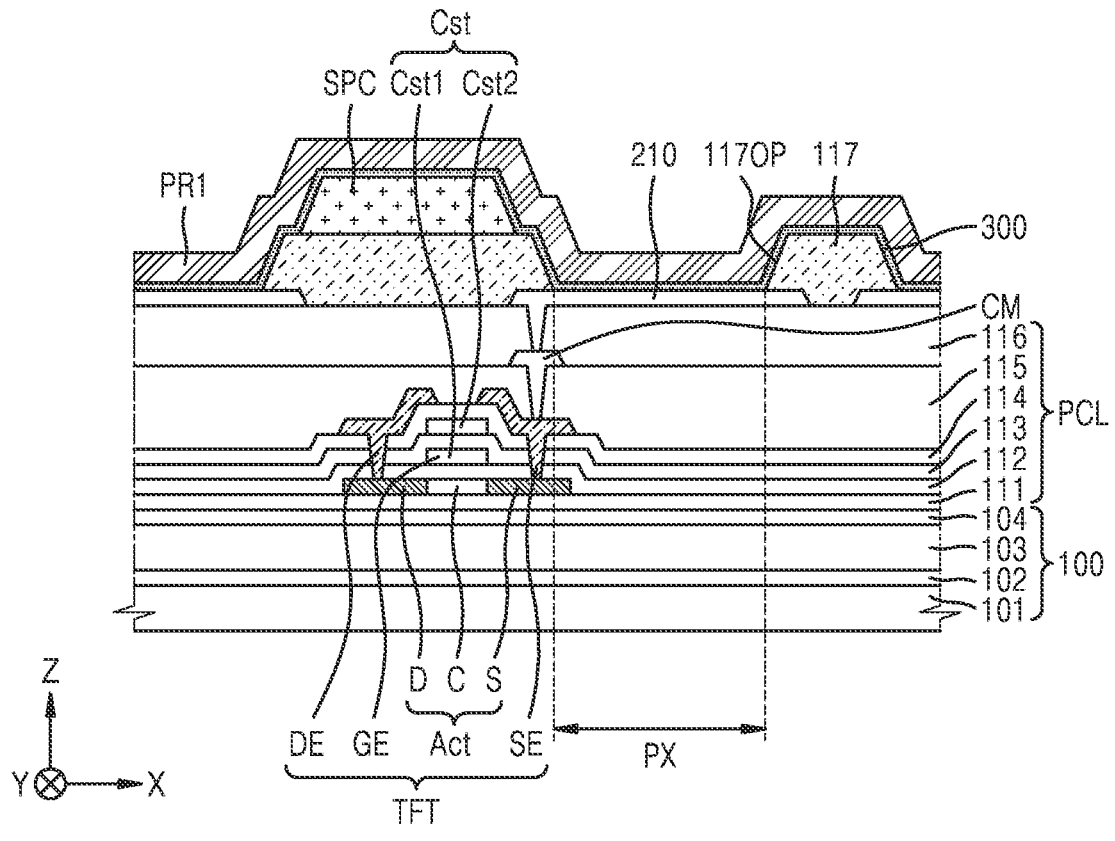

FIG. 11 may correspond to a view of a cross-section taken along the line VIII-VIII' of FIG. 5, and FIG. 12 may correspond to a view of a cross-section taken along the line VI-VI' of FIG. 5.

Referring to FIG. 11, a first photoresist layer PR1 may be disposed over the blocking layer 300. The first photoresist layer PR1 may be arranged on the upper surface of the blocking layer 300. The first photoresist layer PR1 may include a first photo opening PROP1. The first photo opening PROP1 may overlap with the first hole 116H. The area of the planar shape of the first photo opening PROP1 may be greater than the area of the planar shape of the first hole 116H. Thus, the first photoresist layer PR1 may not overlap with the first hole 116H.

Referring to FIG. 12, the first photoresist layer PR1 may be disposed over the blocking layer 300.

The process of arranging the first photoresist layer PR1 as illustrated in FIG. 11 and the process of arranging the first photoresist layer PR1 as illustrated in FIG. 12 may be concurrently (e.g., simultaneously or substantially simultaneously) performed with each other.

Figure 13:
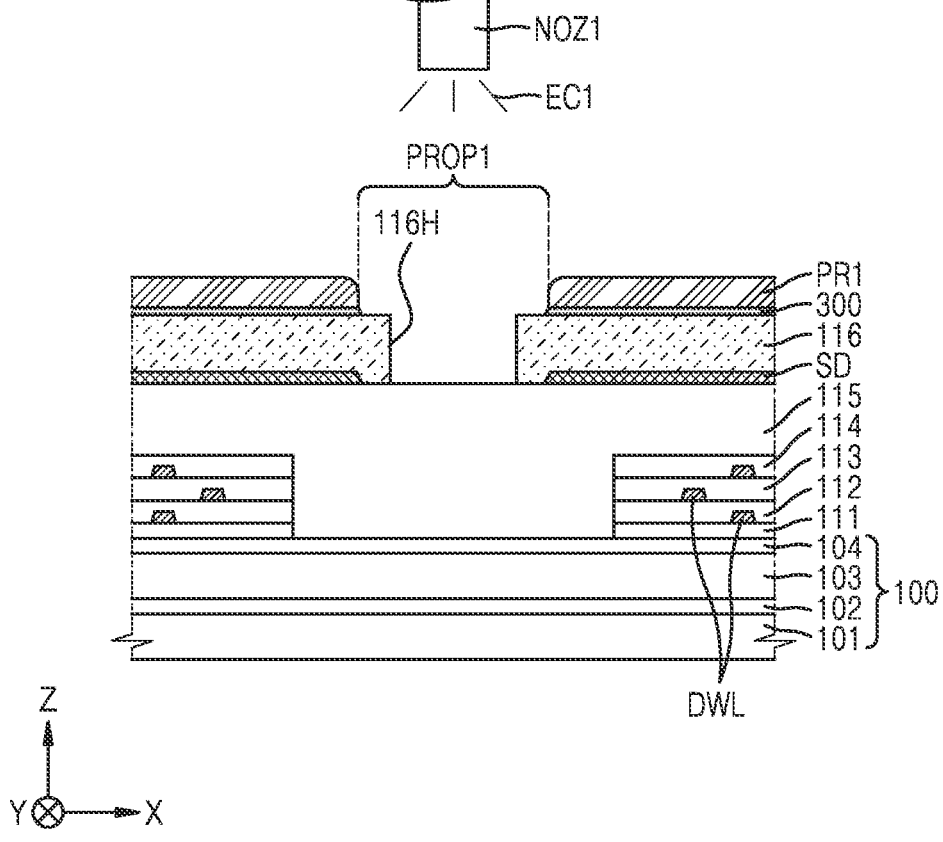
Figure 14:
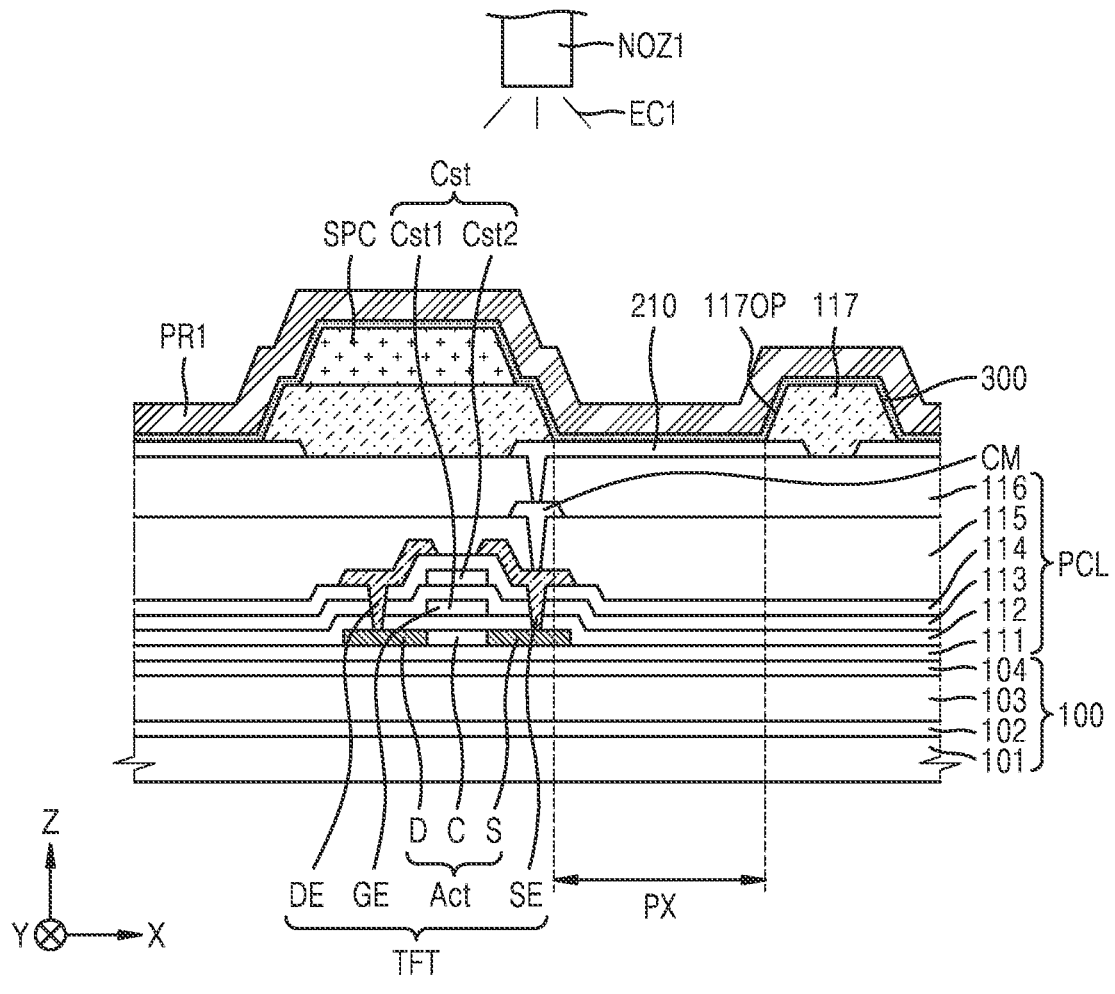

FIG. 13 may correspond to a view of a cross-section taken along the line VIII-VIII' of FIG. 5, and FIG. 14 may correspond to a view of a cross-section taken along the line VI-VI' of FIG. 5.

Referring to FIG. 13, a first etchant EC1 may be sprayed on the first photoresist layer PR1. The first etchant EC1 may be sprayed through a first nozzle NOZ1. A portion of the blocking layer 300 may be removed by reacting with the first etchant EC1. The blocking layer 300 overlapping with the first photoresist layer PR1 may not be exposed to the first etchant EC1. Thus, the blocking layer 300 overlapping with the first photoresist layer PR1 may not be removed by the first etchant EC1. The portion of the blocking layer 300 overlapping with the first photo opening PROP1 may be exposed to the first etchant EC1. Thus, the portion of the blocking layer 300 overlapping with the first photo opening PROP1 may be removed by the first etchant EC1. In other words, the portion of the blocking layer 300 arranged on the side surface of the second planarization insulating layer 116 where the first hole 116H is arranged, and the upper surface of the first planarization insulating layer 115 may be removed by reacting with the first etchant EC1.

Referring to FIG. 14, the first etchant EC1 may be sprayed on the first photoresist layer PR1. The first etchant EC1 may be sprayed through the first nozzle NOZ1 to remove the blocking layer 300 that reacts with the first etchant EC1. In FIG. 14, the blocking layer 300 may overlap with the first photoresist layer PR1. Thus, the blocking layer 300 may not be exposed to the first etchant EC1, and may not be removed by the first etchant EC1.

The process of spraying the first etchant EC1 by the first nozzle NOZ1 as illustrated in FIG. 13 and the process of spraying the first etchant EC1 by the first nozzle NOZ1 as illustrated in FIG. 14 may be concurrently (e.g., simultaneously or substantially simultaneously) performed with each other.

Figure 15:
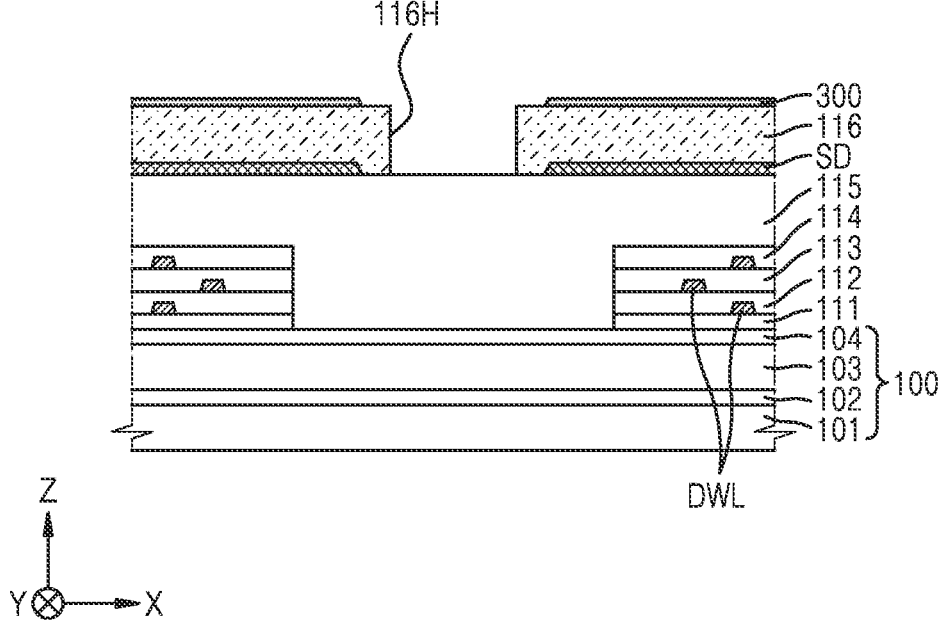
Figure 16:
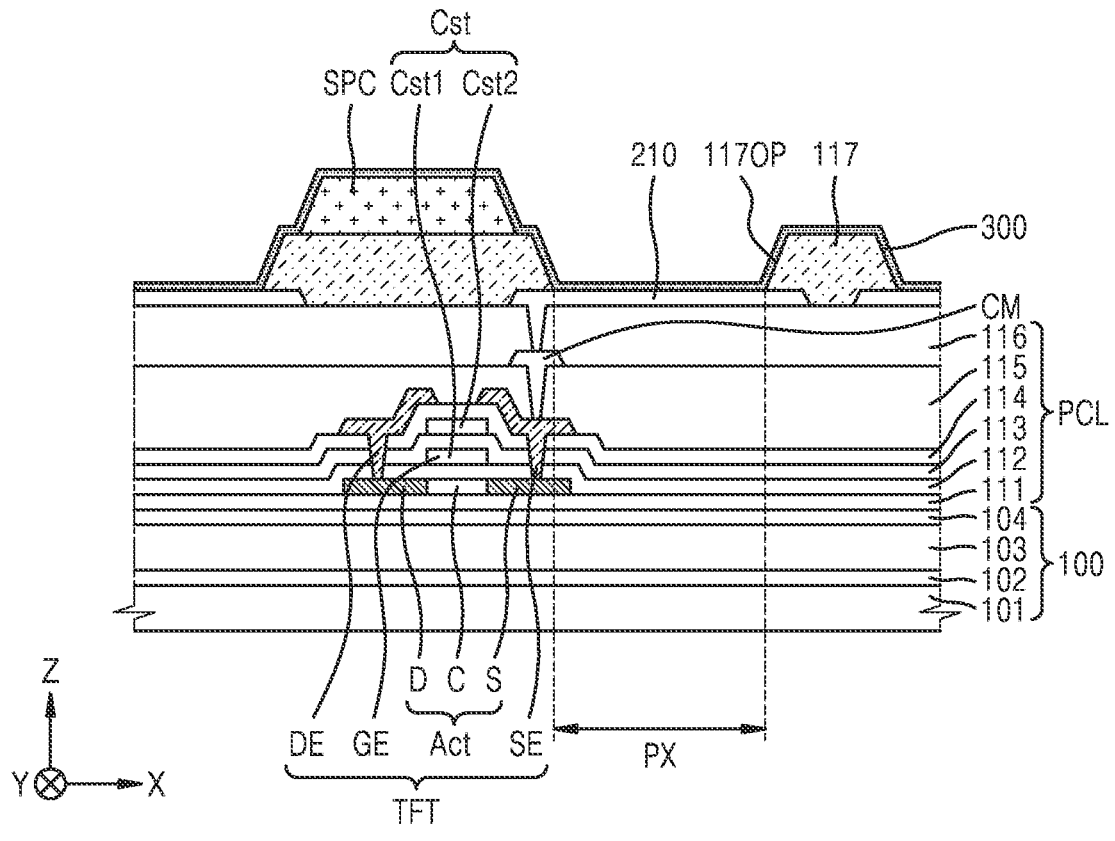

FIG. 15 may correspond to a view of a cross-section taken along the line VIII-VIII' of FIG. 5, and FIG. 16 may correspond to a view of a cross-section taken along the line VI-VI' of FIG. 5.

Referring to FIGS. 15 and 16, all of the first photoresist layer PR1 may be removed. The process of removing the first photoresist layer PR1 as illustrated in FIG. 15 and the process of removing the first photoresist layer PR1 as illustrated in FIG. 16 may be concurrently (e.g., simultaneously or substantially simultaneously) performed with each other.

Figure 17:
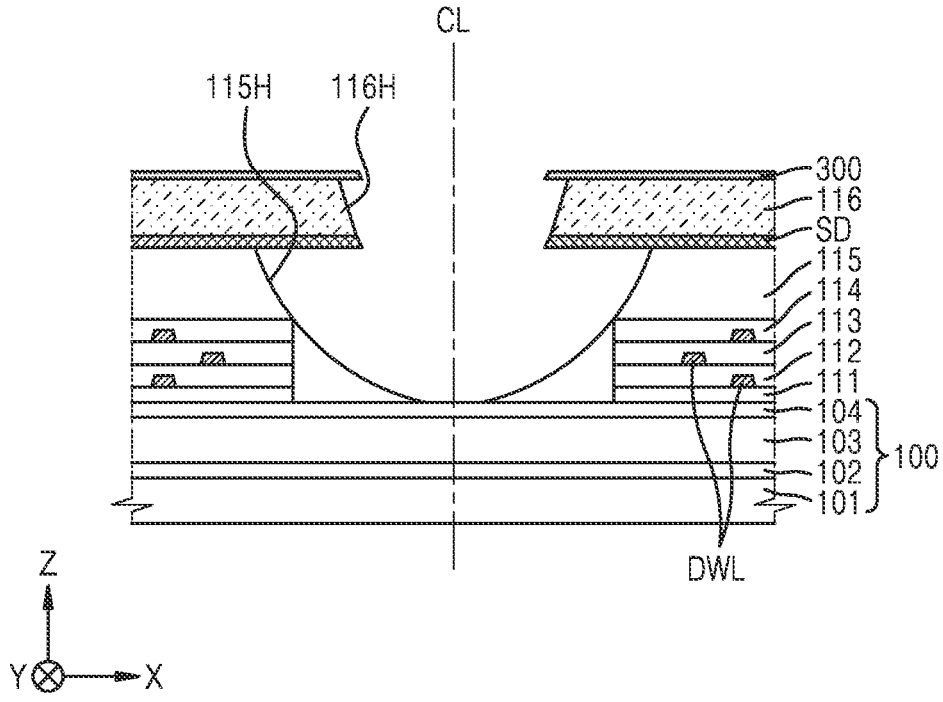
Figure 18:
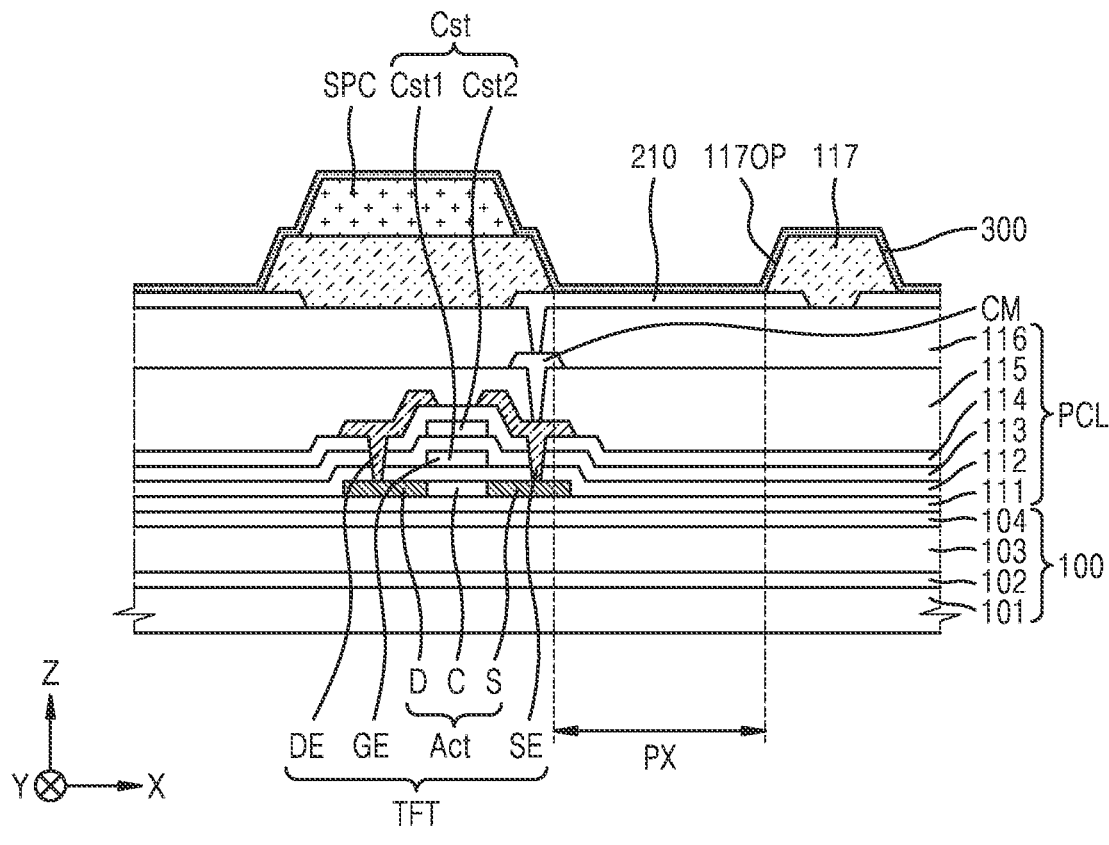

FIG. 17 may correspond to a view of a cross-section taken along the line VIII-VIII' of FIG. 5, and FIG. 18 may correspond to a view of a cross-section taken along the line VI-VI' of FIG. 5.

Referring to FIG. 17, an etching gas may be sprayed onto the blocking layer 300. The blocking layer 300 and the source-drain layer SD may not be removed even when contacting the etching gas. Portions of the first planarization insulation layer 115 and the second planarization insulation layer 116 exposed from the blocking layer 300 and the source-drain layer SD may be removed by reacting with the etching gas.

As the portion of the second planarization insulating layer 116 is removed, a volume of the first hole 116H may increase. In other words, the area of the first hole 116H may increase in a plan view. As the portion of the second planarization insulation layer 116 is removed, the end of the blocking layer 300 may protrude from the second planarization insulation layer 116 toward the center axis CL. The end of the second planarization insulating layer 116 may be arranged on the lower surface of the blocking layer 300 and the edge of the source-drain layer SD.

As the portion of the first planarization insulation layer 115 is removed, the second hole 115H may be arranged in the first planarization insulation layer 115. As the portion of the first planarization insulating layer 115 is removed, the upper surface of the substrate may be exposed from the first planarization insulating layer 115. Also, the end of the source-drain layer SD may protrude from the first planarization insulating layer 115 toward the center axis CL. The end of the first planarization insulating layer 115 may be arranged on the upper surface of the substrate and the lower surface of the source-drain layer SD.

Referring to FIG. 18, the etching gas may be sprayed onto the blocking layer 300. The blocking layer 300 may not be removed even when contacting the etching gas. In FIG. 18, the first planarization insulation layer 115 and the second planarization insulation layer 116 are not exposed by the blocking layer 300, and thus, may not be removed by the etching gas.

The process of spraying the etching gas as illustrated in FIG. 17 and the process of spraying the etching gas as illustrated in FIG. 18 may be concurrently (e.g., simultaneously or substantially simultaneously) performed with each other.

Figure 19:
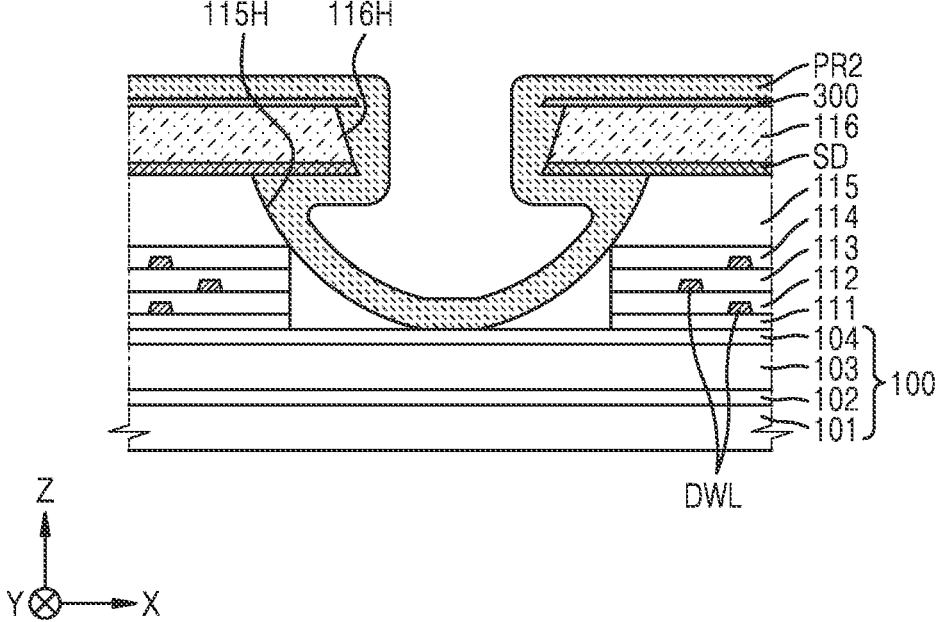
Figure 20:
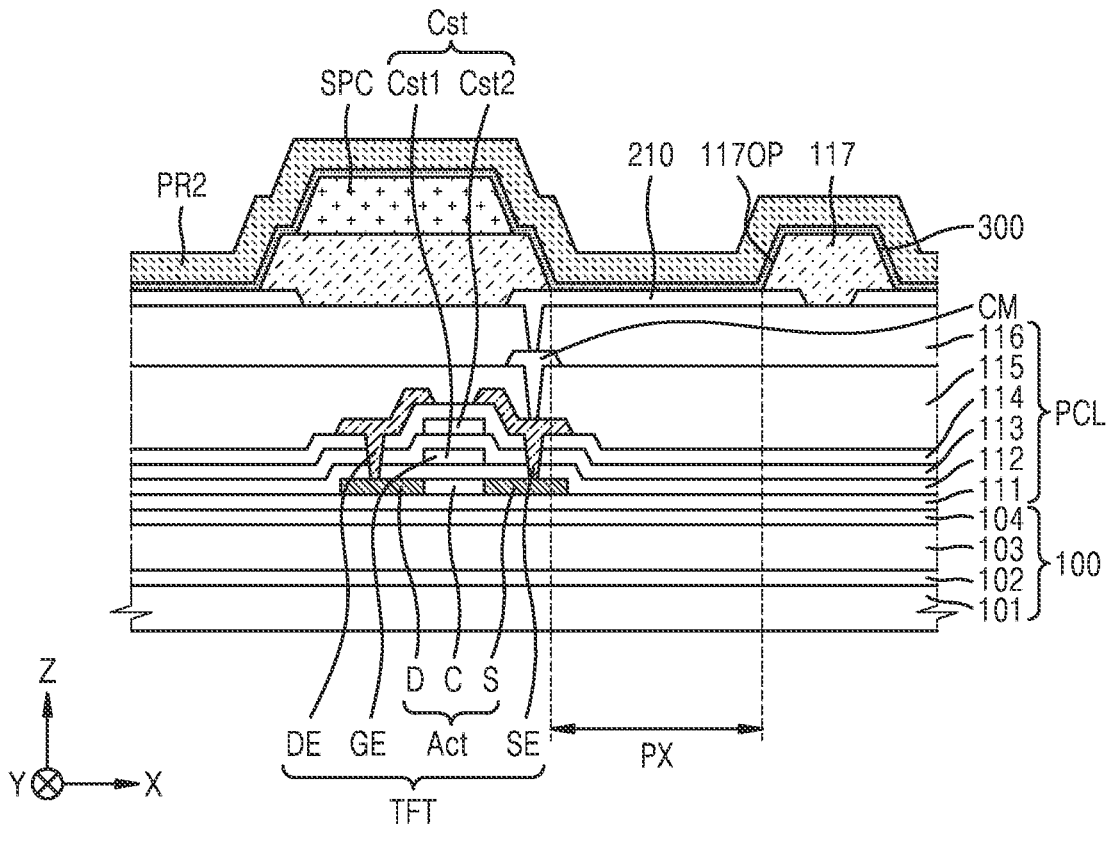

FIG. 19 may correspond to a view of a cross-section taken along the line VIII-VIII' of FIG. 5, and FIG. 20 may correspond to a view of a cross-section taken along the line VI-VI' of FIG. 5.

Referring to FIG. 19, a second photoresist layer PR2 may be disposed over the blocking layer 300. The second photoresist layer PR2 may be arranged to overlap with the first hole 116H and the second hole 115H. The second photoresist layer PR2 may be arranged on the upper surface of the blocking layer 300, the side surface of the blocking layer 300, the lower surface of the blocking layer 300, the side surface of the second planarization insulating layer 116, side surface of the source-drain layer SD, the lower surface of the source-drain layer SD, the side surface of the first planarization insulating layer 115, and the upper surface of the substrate.

Referring to FIG. 20, the second photoresist layer PR2 may be disposed over the blocking layer 300.

The process of arranging the second photoresist layer PR2 as illustrated in FIG. 19 and the process of arranging the second photoresist layer PR2 as illustrated in FIG. 20 may be concurrently (e.g., simultaneously or substantially simultaneously) performed with each other. Also, the first photoresist layer PR1 as illustrated in FIGS. 11 and 12 and the second photoresist layer PR2 as illustrated in FIGS. 19 and 20 may include the same or substantially the same material as each other.

Figure 21:
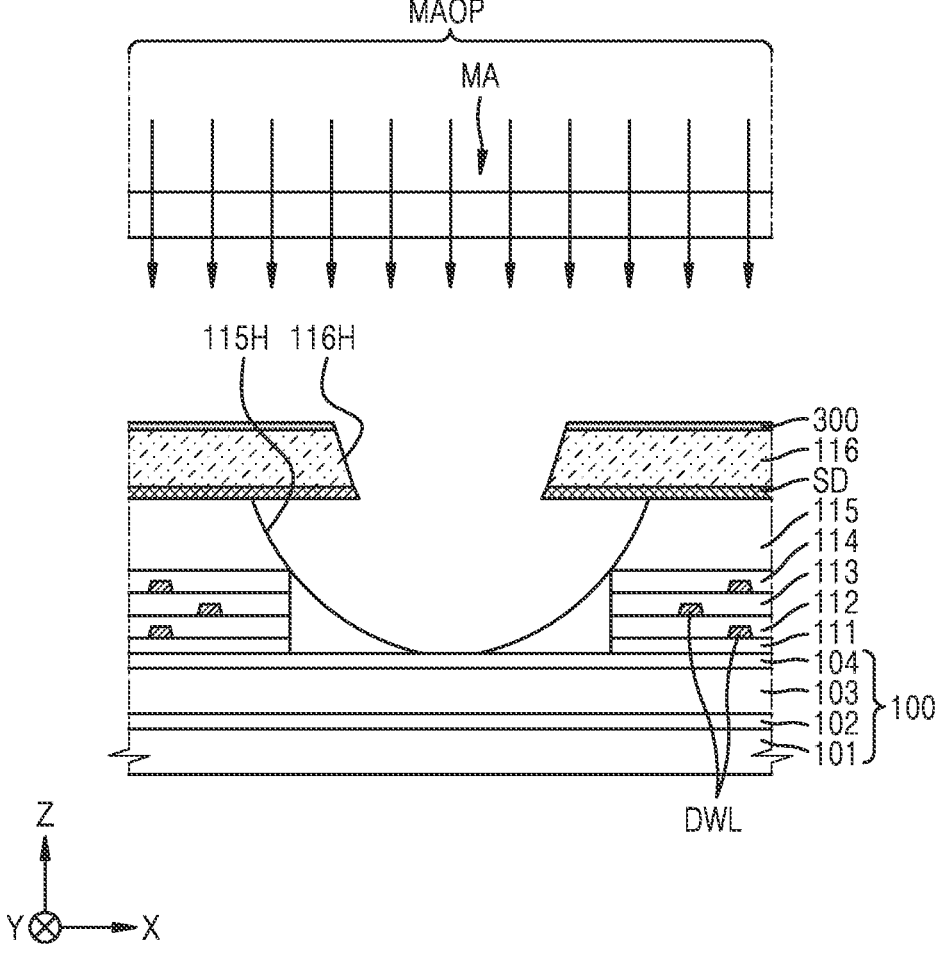
Figure 22:
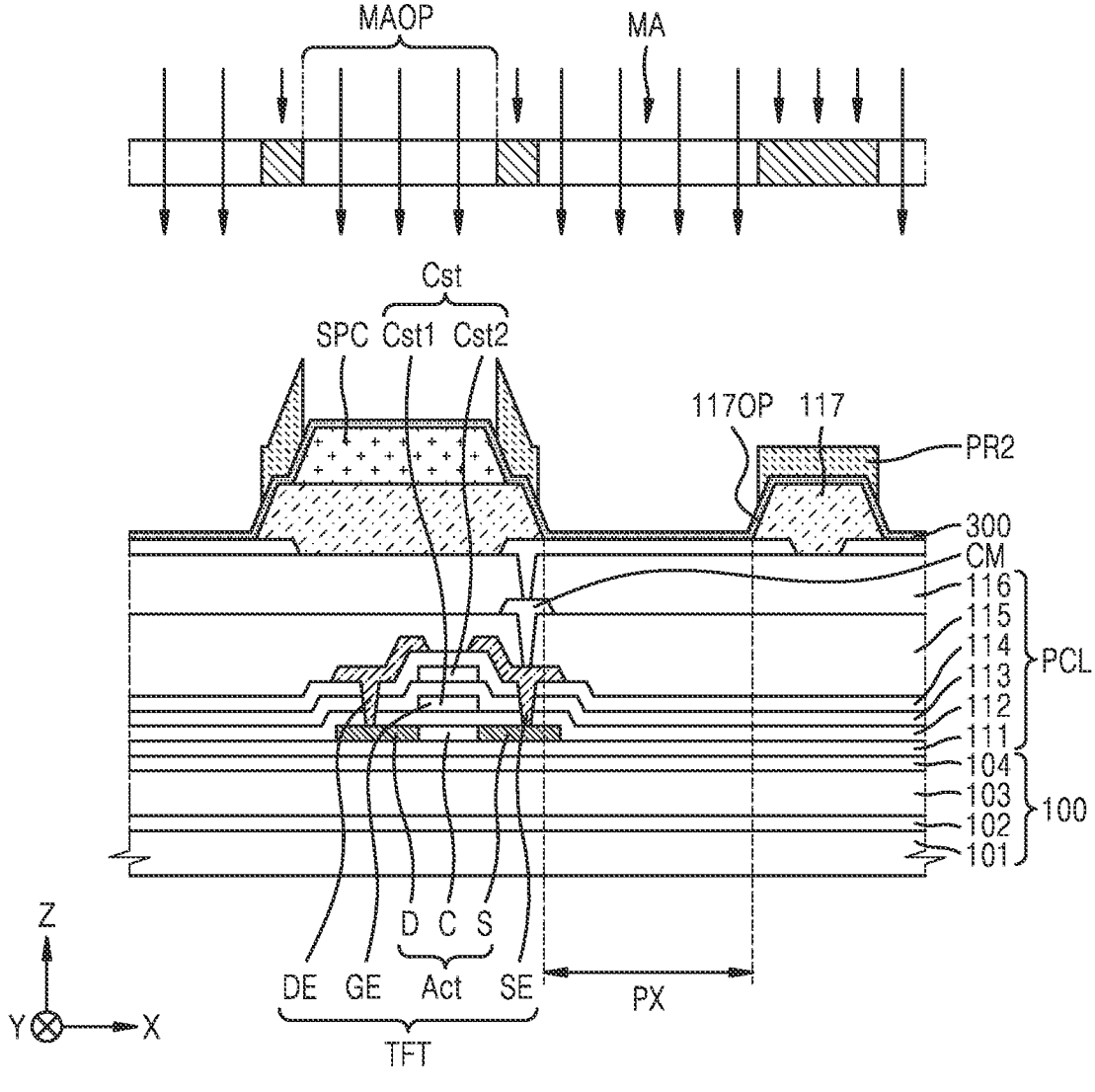

FIG. 21 may correspond to a view of a cross-section taken along the line VIII-VIII' of FIG. 5, and FIG. 22 may correspond to a view of a cross-section taken along the line VI-VI' of FIG. 5.

Referring to FIGS. 21 and 22, a mask MA may be disposed over the second photoresist layer PR2, and light may be irradiated onto the mask MA. The mask MA may include a mask opening MAOP. The light irradiated onto the mask MA may pass through the mask opening MAOP. The light passing through the mask opening MAOP may be irradiated onto the second photoresist layer PR2 to remove a portion of the second photoresist layer PR2. In other words, the portion of the second photoresist layer PR2 overlapping with the mask opening MAOP may be removed.

Referring to FIG. 21, the mask opening MAOP may overlap with the second photoresist layer PR2. Light may be irradiated onto the second photoresist layer PR2, and the second photoresist layer PR2 may be removed.

Referring to FIG. 22, the mask opening MAOP may overlap with a portion of the second photoresist layer PR2. The mask opening MAOP may overlap with the upper and side surfaces of the spacer SPC. The mask opening MAOP may overlap with the side surface of the bank layer 117 and the upper surface of the pixel electrode 210. Only the portion of the second photoresist layer PR2 overlapping with the mask opening MAOP may be removed. In this structure, the second photoresist layer PR2 remaining after irradiation of the light may be arranged on the blocking layer 300 on the side surface of the bank layer 117 and the side surface of the spacer SPC. Also, the second photoresist layer PR2 remaining after irradiation of the light may be arranged on the blocking layer 300 on the side surface of the bank layer 117 and the upper surface of the bank layer 117.

The mask MA as illustrated in FIG. 21 and the mask MA as illustrated in FIG. 22 may be the same mask MA. Also, the process of irradiating the light as illustrated in FIG. 21 and the process of irradiating the light as illustrated in FIG. 22 may be concurrently (e.g., simultaneously or substantially simultaneously) performed with each other.

Figure 23:
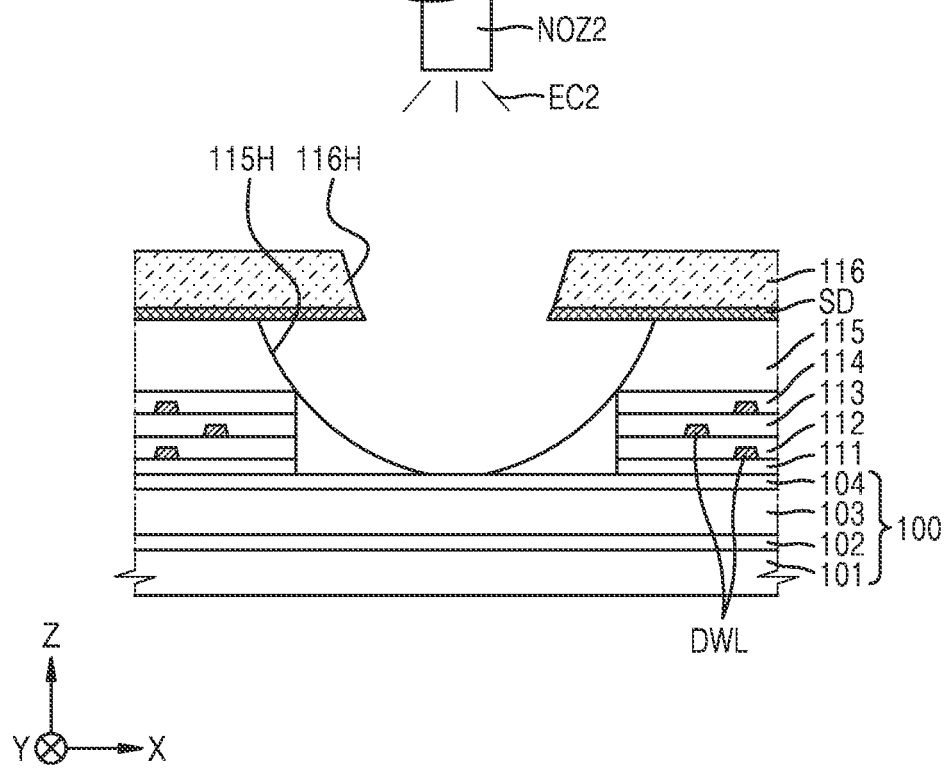
Figure 24:
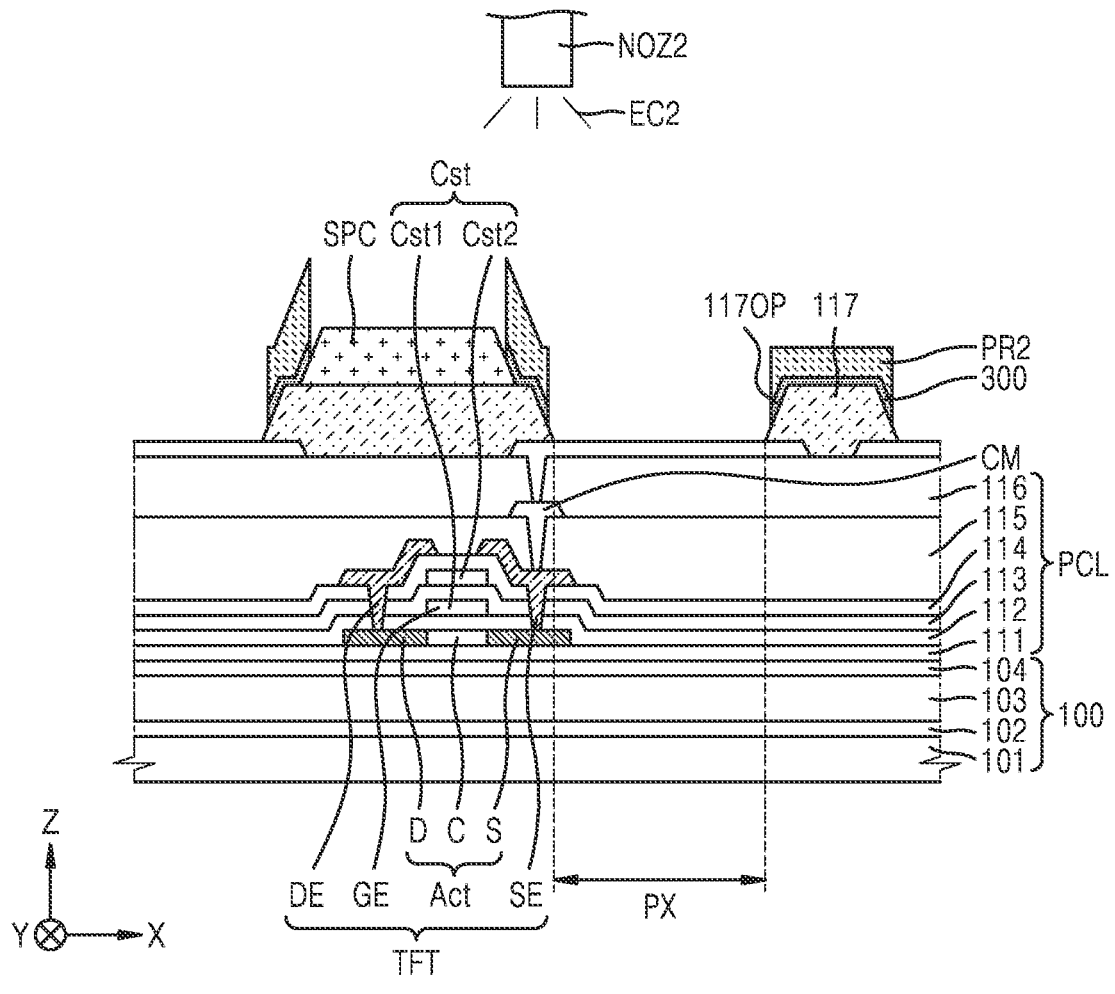

FIG. 23 may correspond to a view of a cross-section taken along the line VIII-VIII' of FIG. 5, and FIG. 24 may correspond to a view of a cross-section taken along the line VI-VI' of FIG. 5.

Referring to FIG. 23, a second etchant EC2 may be sprayed on the second photoresist layer PR2. The second etchant EC2 may be sprayed through a second nozzle NOZ2. The blocking layer 300 may be removed by reacting with the second etchant EC2.

Referring to FIG. 24, the second etchant EC2 may be sprayed on the second photoresist layer PR2. The second etchant EC2 may be sprayed through the second nozzle NOZ2. The blocking layer 300 may be removed by reacting with the second etchant EC2. The blocking layer 300 overlapping with the second photoresist layer PR2 may not be exposed to the second etchant EC2. Thus, the blocking layer 300 overlapping with the second photoresist layer PR2 may not be removed by the second etchant EC2. In other words, the blocking layer 300 arranged on the side surface of the spacer SPC and the side surface of the bank layer 117 may not be removed by the second etchant EC2. Also, the blocking layer 300 arranged on the side surface and the upper surface of the bank layer 117 may not be removed by the second etchant EC2.

As illustrated in FIG. 24, a portion of the blocking layer 300 may be removed, such that the blocking layer 300 may be spaced apart from the pixel electrode 210.

The process of spraying the second etchant EC2 by the second nozzle NOZ2 as illustrated in FIG. 23 and the process of spraying the second etchant EC2 by the second nozzle NOZ2 as illustrated in FIG. 24 may be concurrently (e.g., simultaneously or substantially simultaneously) performed with each other. The first nozzle NOZ1 illustrated in FIGS. 13 and 14 may be the same or substantially the same as the second nozzle NOZ2 illustrated in FIGS. 23 and 24. Also, the first etchant EC1 illustrated in FIGS. 13 and 14 may include the same or substantially the same material as that of the second etchant EC2 illustrated in FIGS. 23 and 24.

Figure 25:
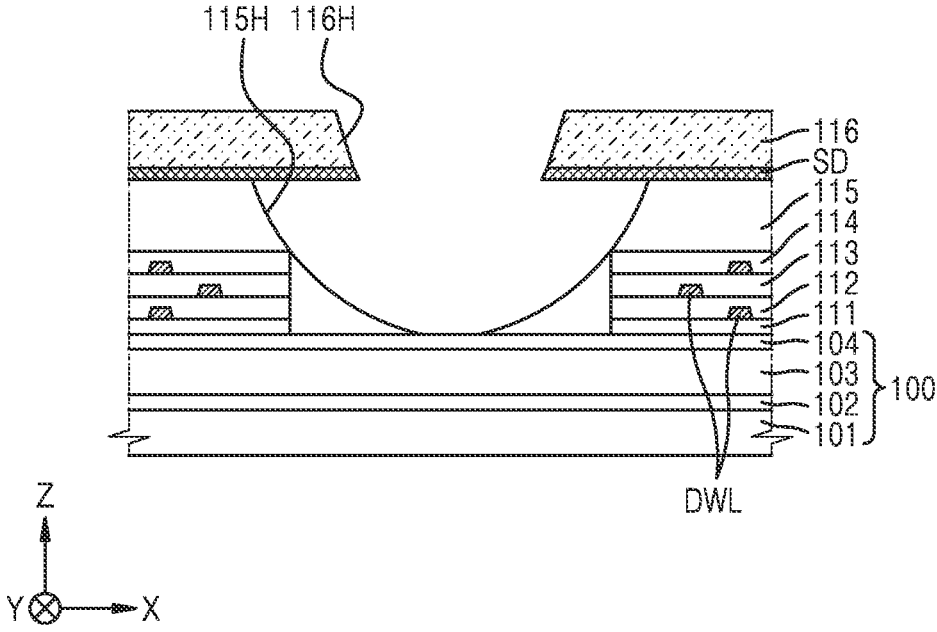
Figure 26:
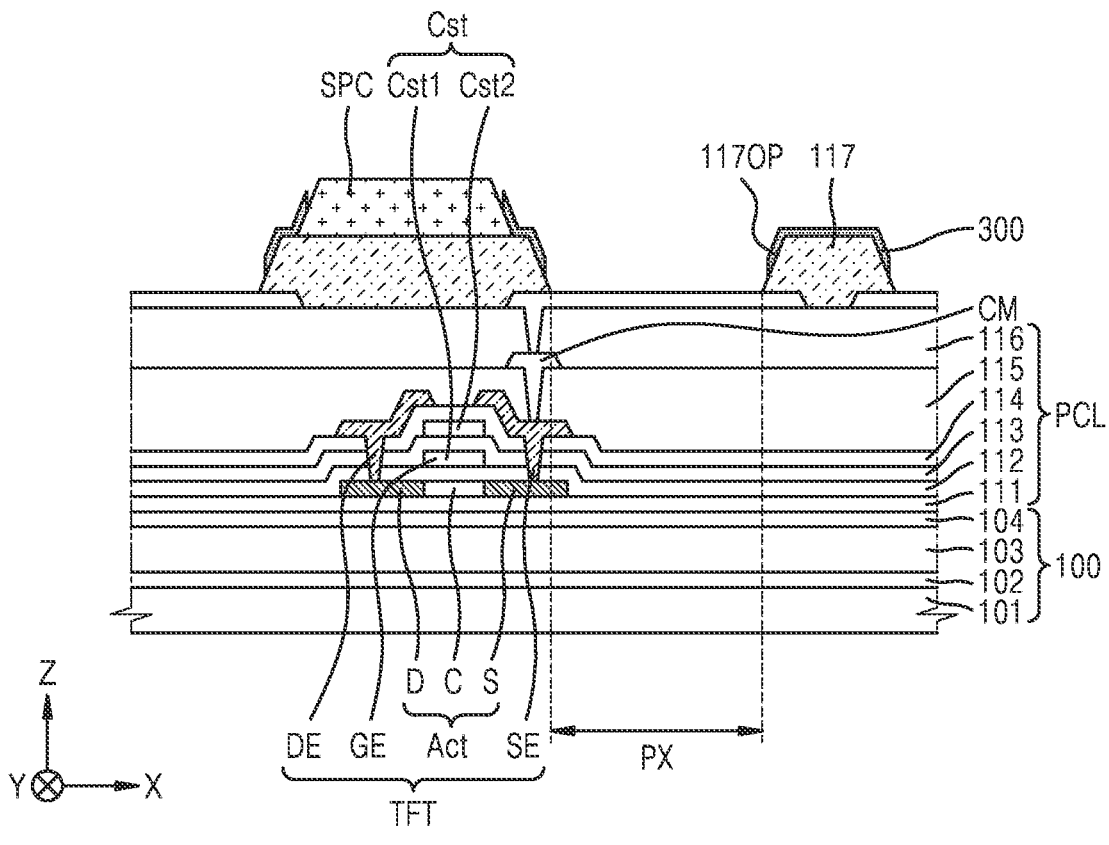

FIG. 25 may correspond to a view of a cross-section taken along the line VIII-VIII' of FIG. 5, and FIG. 26 may correspond to a view of a cross-section taken along the line VI-VI' of FIG. 5.

Referring to FIGS. 25 and 26, all of the second photoresist layer PR2 may be removed. The process of removing the second photoresist layer PR2 as illustrated in FIG. 25 and the process of removing the second photoresist layer PR2 as illustrated in FIG. 26 may be concurrently (e.g., simultaneously or substantially simultaneously) performed with each other.

Figure 27:
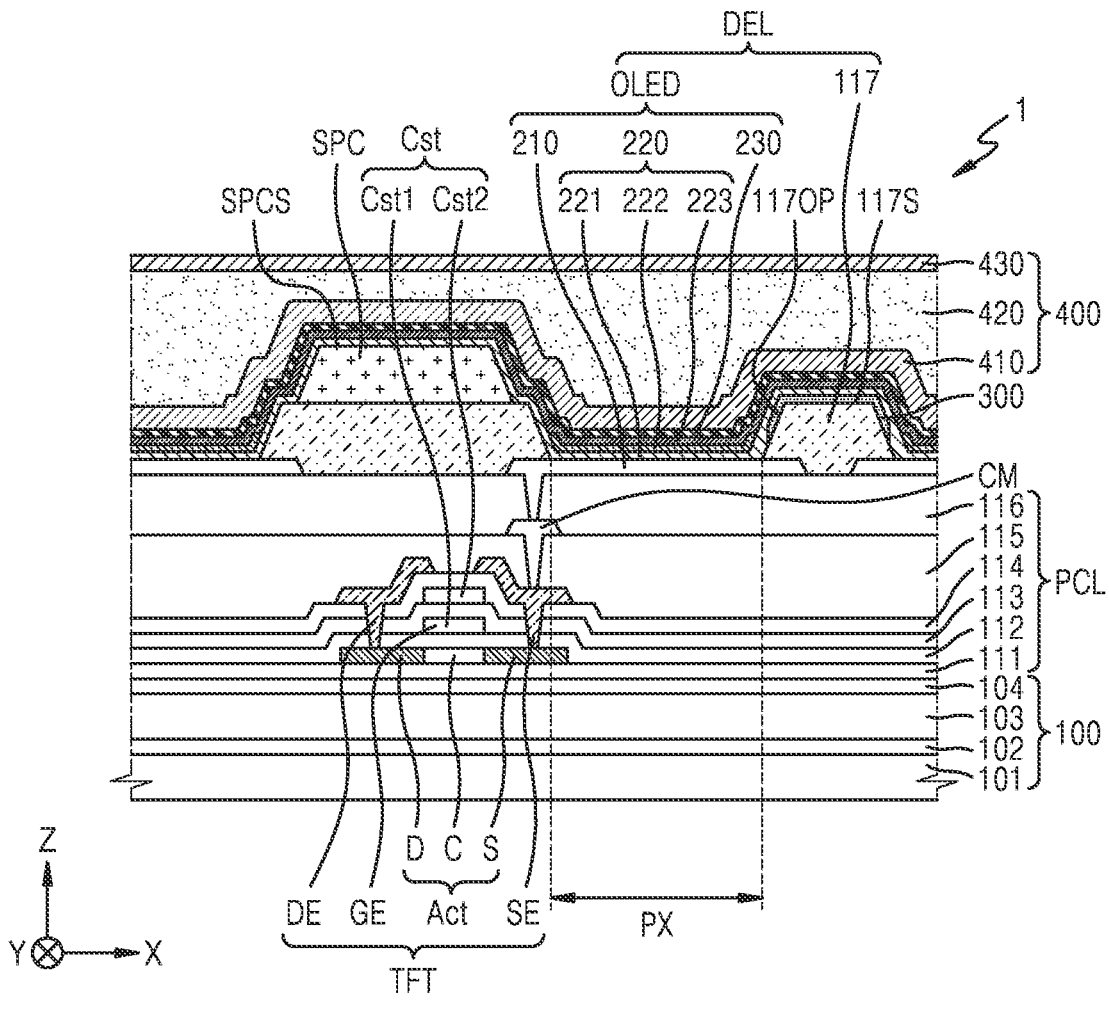
FIG. 27 is a cross-sectional view of a display apparatus according to another embodiment.

FIG. 27 is a cross-sectional view of a display apparatus according to another embodiment. For example, FIG. 27 may correspond to a view of a cross-section taken along the line VI-VI' of FIG. 5. In FIG. 27, the same reference symbols are used to denote the same or substantially the same elements and members as those described above with reference to FIG. 6, and thus, redundant description thereof may not be repeated.

Unlike the embodiment described above with reference to FIG. 6, in FIG. 27, the blocking layer 300 may not be arranged on the side surfaces of the bank layer 117 and the spacer SPC disposed over the bank layer 117. In other words, the blocking layer 300 may be arranged only on the upper and side surfaces of the bank layer 117.

Figure 28:
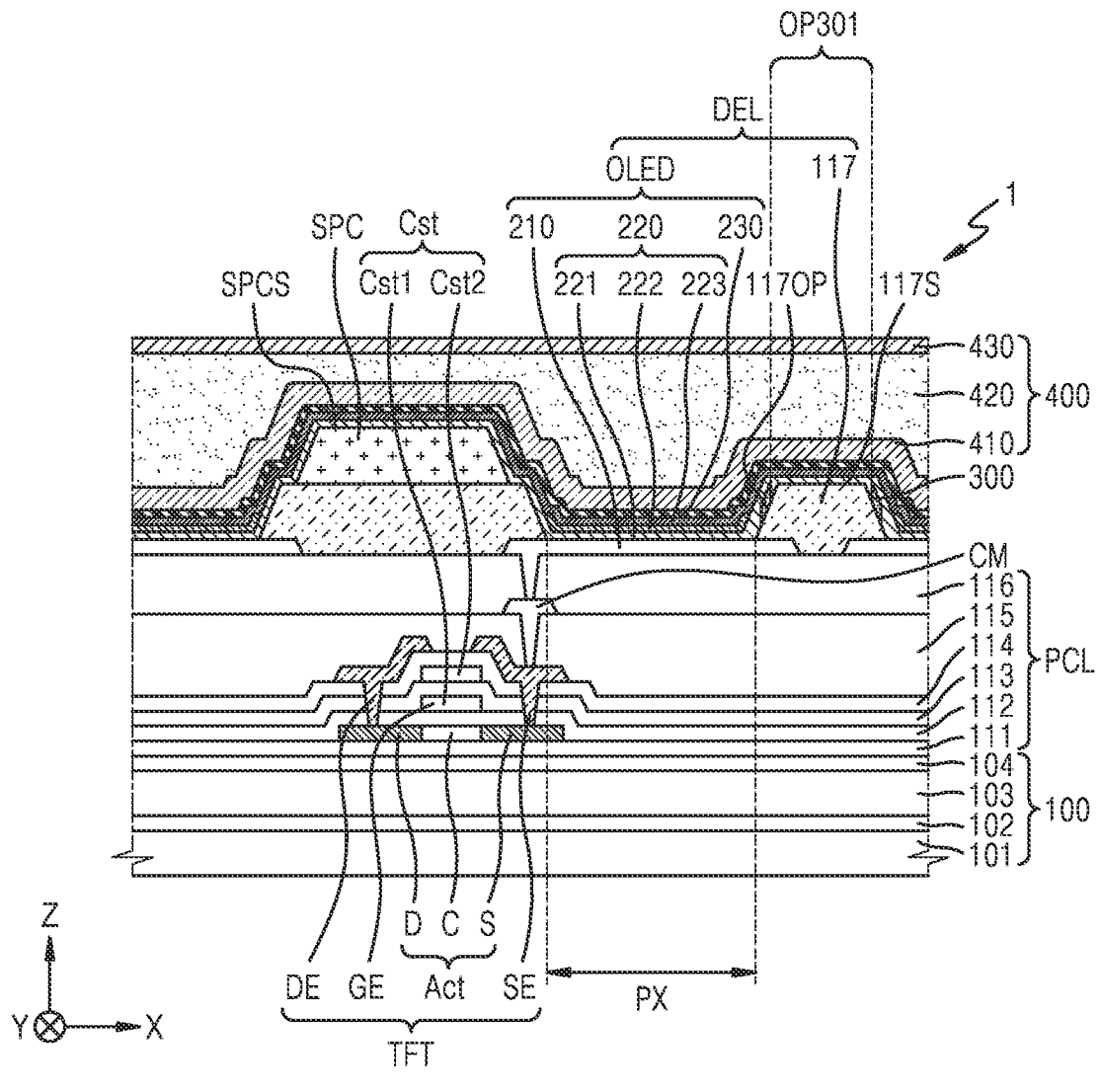
FIG. 28 is a cross-sectional view of a display apparatus according to another embodiment.

FIG. 28 is a cross-sectional view of a display apparatus according to another embodiment. For example, FIG. 28 may correspond to a view of a cross-section taken along the line VI-VI' of FIG. 5. In FIG. 28, the same reference symbols are used to denote the same or substantially the same elements and members as those described above with reference to FIG. 6, and thus, redundant description thereof may not be repeated.

Unlike the embodiment described above with reference to FIG. 27, in FIG. 28, the blocking layer 300 may include a first opening OP301 exposing at least a portion of the upper surface of the bank layer 117. The first opening OP301 may overlap with the upper surface of the bank layer 117. An end of the blocking layer 300 may be arranged on the side surface of the bank layer 117. In this structure, the height (e.g., in the Z-direction) of the blocking layer 300 may be lower than the height (e.g., in the Z-direction) of the upper surface of the bank layer 117. Also, the blocking layer 300 may be arranged to be spaced apart from the pixel electrode 210.

Figure 29:
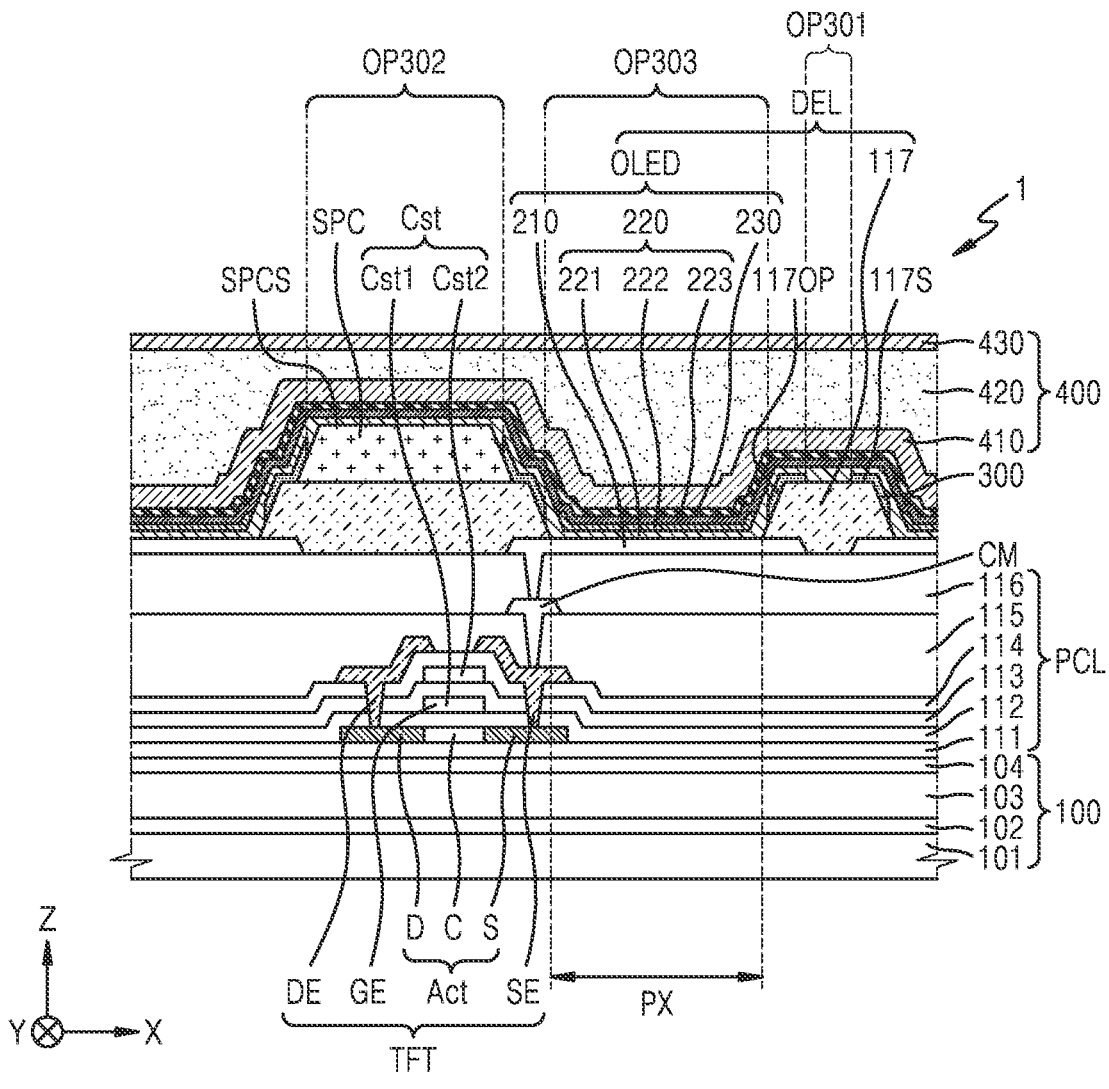
FIG. 29 is a cross-sectional view of a display apparatus according to another embodiment.

FIG. 29 is a cross-sectional view of a display apparatus according to another embodiment. For example, FIG. 29 may correspond to a view of a cross-section taken along the line VI-VI' of FIG. 5. In FIG. 29, the same reference symbols are used to denote the same or substantially the same elements and members as those described above with reference to FIG. 6, and thus, redundant description thereof may not be repeated.

Unlike in the embodiment described above with reference to FIG. 6, in FIG. 29, the blocking layer 300 may include a first opening OP301 exposing at least a portion of the upper surface of the bank layer 117. Also, unlike in the embodiment described above with reference to FIG. 28, in FIG. 29, the end of the blocking layer 300 may be arranged on the upper and side surfaces of the bank layer 117. The blocking layer 300 may have a shape that is bent around the edge, or in other words, the boundary between the upper surface and the side surface of the bank layer 117.

The display apparatus 1 described above with reference to FIGS. 27 through 29 may be manufactured by the same or substantially the same method as that of the display apparatus manufacturing method described above with reference to FIGS. 9 through 26. In addition to the display apparatus 1 described above with reference to FIGS. 27 through 29, the shape and arrangement of the blocking layer 300 may be various modified according to the shape and pattern of the mask opening of the mask (e.g., see FIG. 22).

According to one or more embodiments of the present disclosure, gas that may be generated by the outgassing phenomenon may react with the pixel electrode to oxidize the pixel electrode, thereby reducing a phenomenon in which a size of the pixel may decrease.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display apparatus comprising:
   a substrate;
   a pixel electrode over the substrate;
   a bank layer over the pixel electrode, and including a pixel opening exposing at least a portion of the pixel electrode; and
   a blocking layer configured to block ultraviolet rays, and defining a first opening exposing at least a portion of an upper surface of the bank layer, at least a portion of the blocking layer being located over the bank layer and spaced from the pixel electrode.

2. The display apparatus of claim 1, wherein the blocking layer overlaps with an upper surface of the bank layer.

3. The display apparatus of claim 1, wherein an end of the blocking layer is on a side surface of the bank layer.

4. The display apparatus of claim 1, wherein an end of the blocking layer is on the upper surface of the bank layer.

5. The display apparatus of claim 1, further comprising a spacer over the bank layer,
   wherein at least a portion of the blocking layer is located over the spacer.

6. The display apparatus of claim 5, wherein the blocking layer includes a second opening exposing an upper surface of the spacer.

7. The display apparatus of claim 6, wherein a height of an end of the blocking layer is lower than a height of the upper surface of the spacer.

8. The display apparatus of claim 6, wherein an end of the blocking layer is located on a side surface of the spacer.

9. The display apparatus of claim 1, further comprising:
   a planarization insulating layer located between the substrate and the pixel electrode;
   a first structure penetrating the planarization insulating layer; and
   an optical sensor overlapping with the first structure.

* * * * *